(12) United States Patent
Ho et al.

(10) Patent No.: US 12,154,973 B2
(45) Date of Patent: Nov. 26, 2024

(54) FIN FIELD-EFFECT TRANSISTOR DEVICE AND METHOD

(71) Applicant: Taiwan Semiconductor Manufacturing Co., Ltd., Hsinchu (TW)

(72) Inventors: Tsai-Jung Ho, Xihu Township (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 454 days.

(21) Appl. No.: 17/592,995

(22) Filed: Feb. 4, 2022

(65) Prior Publication Data

US 2023/0025645 A1 Jan. 26, 2023

Related U.S. Application Data

(60) Provisional application No. 63/224,481, filed on Jul. 22, 2021.

(51) Int. Cl.
| | |
|---|---|
| *H01L 29/66* | (2006.01) |
| *H01L 21/02* | (2006.01) |
| *H01L 21/3065* | (2006.01) |
| *H01L 21/8234* | (2006.01) |
| *H01L 29/78* | (2006.01) |

(52) U.S. Cl.
CPC .. *H01L 29/66795* (2013.01); *H01L 21/02271* (2013.01); *H01L 21/3065* (2013.01); *H01L 21/823418* (2013.01); *H01L 21/823431* (2013.01); *H01L 21/823468* (2013.01); *H01L 29/7851* (2013.01)

(58) Field of Classification Search
CPC ..... H01L 21/823468; H01L 21/823431; H01L 29/66795; H01L 29/66621
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,508,597 B1 | 11/2016 | Liu et al. | |

(Continued)

FOREIGN PATENT DOCUMENTS

| | | |
|---|---|---|
| TW | 201810532 A | 3/2018 |
| TW | I624932 B | 5/2018 |

*Primary Examiner* — Jae Lee
(74) *Attorney, Agent, or Firm* — Slater Matsil, LLP

(57) ABSTRACT

A method of forming a semiconductor device includes: forming a gate structure over a fin that protrudes above a substrate; forming source/drain regions over the fin on opposing sides of the gate structure; forming a recess between gate spacers of the gate structure by recessing the gate structure below upper surfaces of the gate spacers; depositing a first layer of a dielectric material in the recess along sidewalls and a bottom of the recess; after depositing the first layer, performing a first etching process to remove portions of the first layer of the dielectric material; and after the first etching process, depositing a second layer of the dielectric material in the recess over the first layer of the dielectric material.

20 Claims, 22 Drawing Sheets

(56) References Cited

U.S. PATENT DOCUMENTS

| | | |
|---|---|---|
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2013/0210241 A1* | 8/2013 | LaVoie .............. H01L 21/02211 |
| | | 257/E21.24 |
| 2016/0315192 A1 | 10/2016 | Sayama et al. |
| 2017/0104066 A1* | 4/2017 | Ando ................... H01L 21/3115 |
| 2021/0327760 A1* | 10/2021 | Ho ........................ H01L 21/022 |
| 2022/0102199 A1* | 3/2022 | Hsiung ............. H01L 21/76834 |

\* cited by examiner

FIN FIELD-EFFECT TRANSISTOR DEVICE AND METHOD

PRIORITY CLAIM AND CROSS-REFERENCE

This application claims priority to U.S. Provisional Patent Application No. 63/224,481, filed Jul. 22, 2021, entitled "Seam Free SiN Gap Fill Formed by High Density Plasma Deposition (HDP)," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
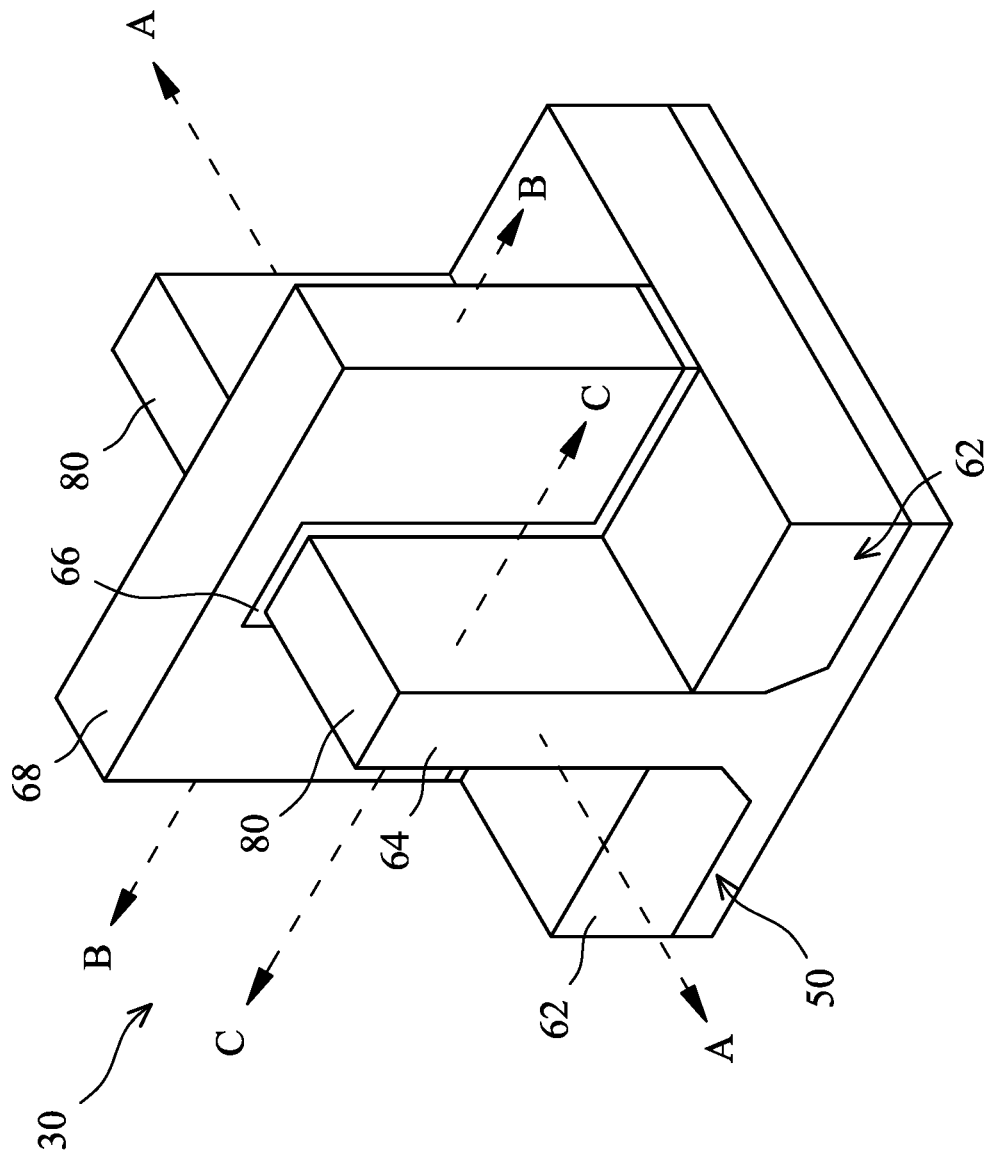
FIG. 1 is a perspective view of a Fin Field-Effect Transistor (FinFET), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise specified, the same or similar reference numeral in different figures refer to the same or similar component formed by the same or similar material(s) using the same or similar formation method.

Embodiments of the present disclosure are discussed in the context of forming a semiconductor device, and in particular, in the context of forming self-aligned contacts for a Fin Field-Effect Transistor (FinFET) device. The principle of the disclosed embodiments may also be applied to other types of devices, such as planar devices.

In accordance with an embodiment of the present disclosure, a metal gate structure is recessed below an upper surface of gate spacers to form a recess between the gate spacers. Next, a multi-step deposition process, referred to as a deposition-etch-deposition (DED) process, is used to fill the recess with a dielectric material. The DED process includes one or more deposition-etch cycles, followed by a final deposition process to fill the recess. Each of deposition-etch cycles includes: a deposition process to form a layer of the dielectric material along sidewalls and a bottom of the recess, and an etching process to remove upper portions of the deposited layer of the dielectric material. The DED process can fill the recess completely without air gaps being formed in the dielectric material, which may avoid or reduce product defects caused by the air gaps in the dielectric material.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate electrode 68 is over the gate dielectric 66. Source/drain regions 80 are in the fin 64 and on opposing sides of the gate dielectric 66 and the gate electrode 68. FIG. 1 further illustrates reference cross-sections that are used in later figures. Cross-section B-B extends along a longitudinal axis of the gate electrode 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Subsequent figures refer to these reference cross-sections for clarity.

FIGS. 2-6, 7A-7C, and 8-21 illustrate cross-sectional views of a Fin Field-Effect Transistor (FinFET) device 100 at various stages of fabrication, in accordance with an embodiment. The FinFET device 100 is similar to the FinFET 30 in FIG. 1, except for multiple fins and multiple gate structures. FIGS. 2-5 illustrate cross-sectional views of the FinFET device 100 along cross-section B-B, and FIGS. 6, 7A, and 8-21 illustrate cross-sectional views of the FinFET device 100 along cross-section A-A. FIGS. 7B and 7C illustrate cross-sectional views of the FinFET device 100 along cross-section C-C.

Figure 2:
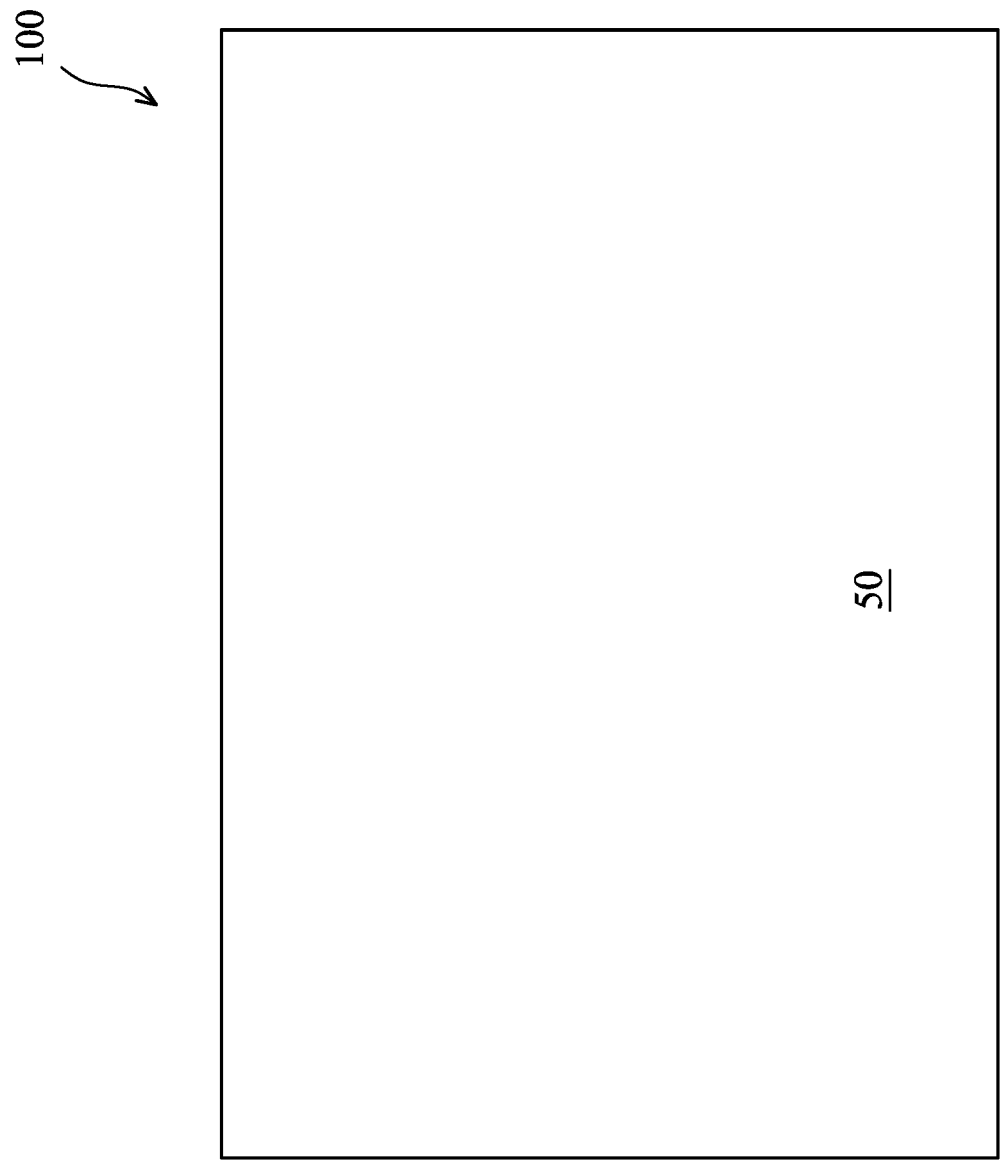
FIGS. 2-6, 7A-7C, and 8-21 illustrate cross-sectional views of a FinFET device at various stages of fabrication, in accordance with an embodiment.

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 3:
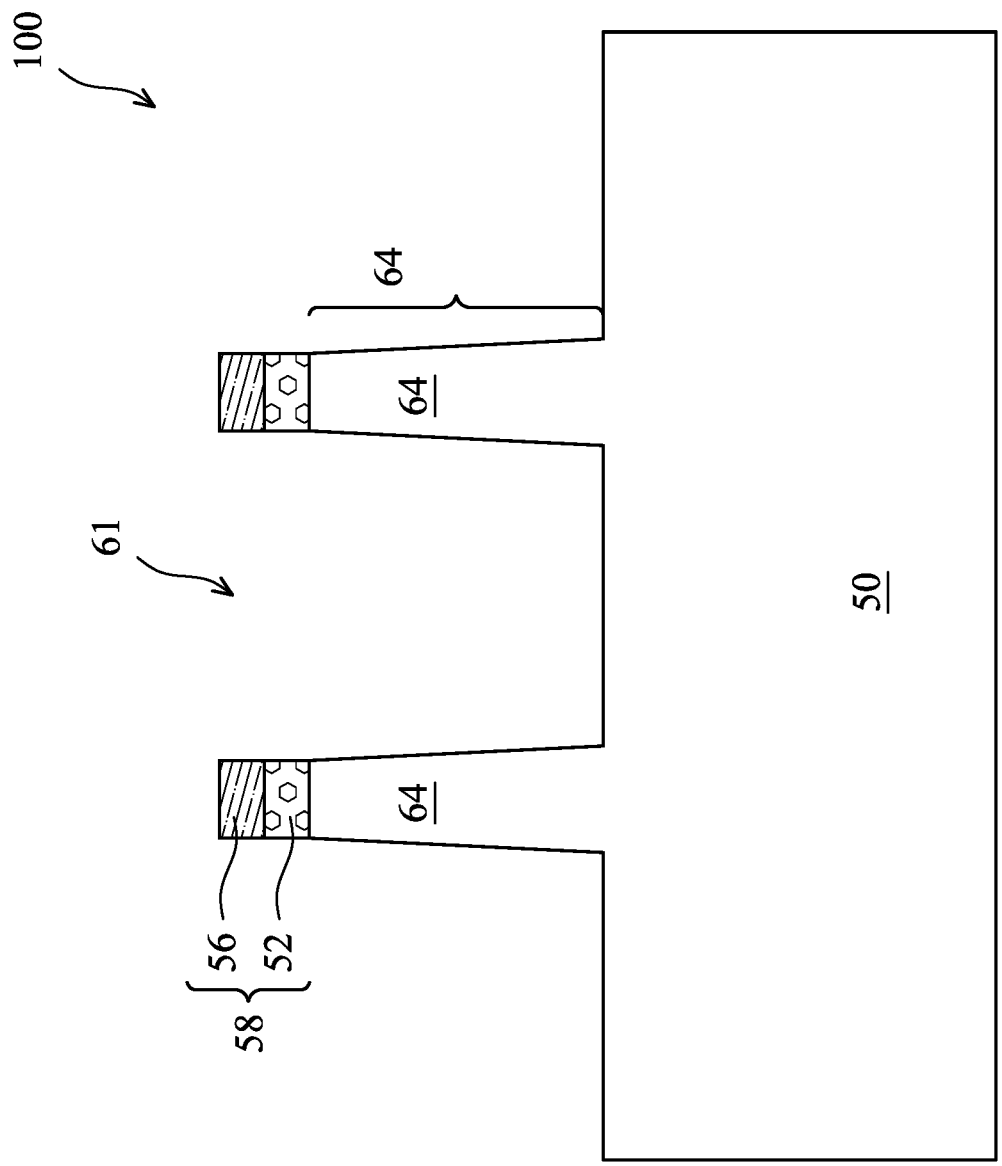

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
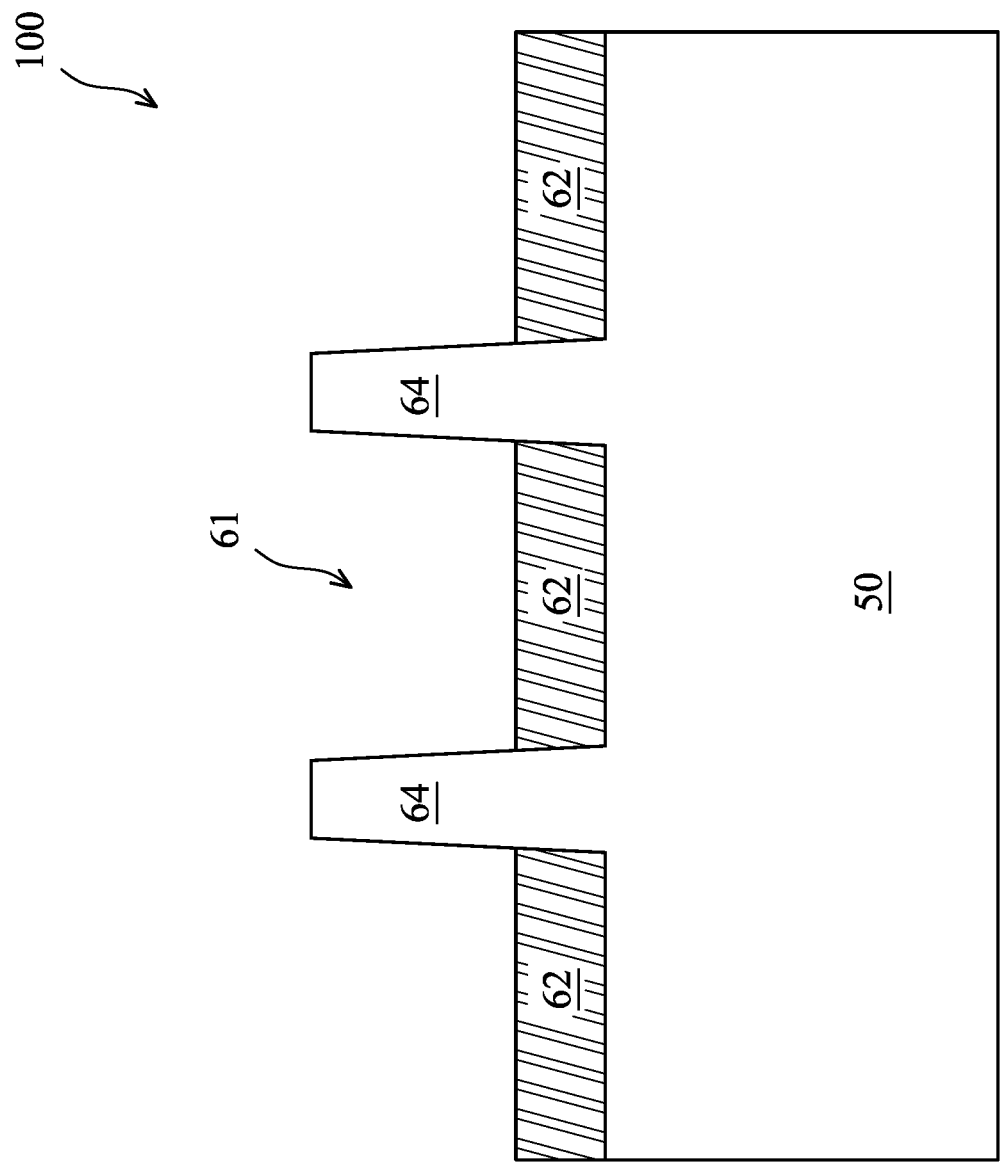

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch, or a wet etch using dilute hydrofluoric (dHF) acid, may be performed to recess the isolation regions 62.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., n-type or p-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
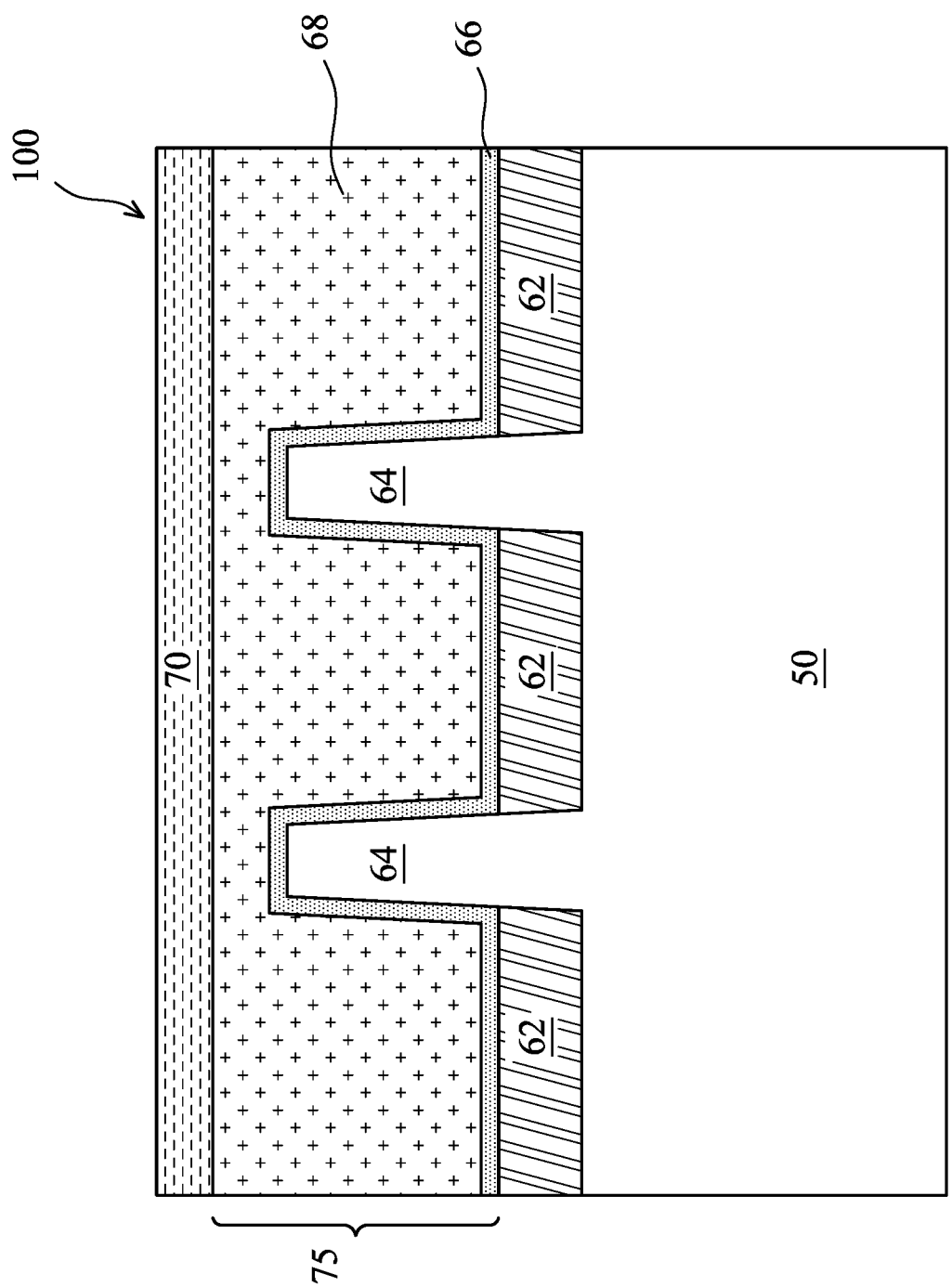

FIG. 5 illustrates the formation of dummy gate structure 75 over the semiconductor fins 64. Dummy gate structure 75 includes gate dielectric 66 and gate electrode 68, in some embodiments. A mask 70 may be formed over the dummy gate structure 75. To form the dummy gate structure 75, a dielectric layer is formed on the semiconductor fins 64. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form mask 70. The pattern of the mask 70 then may be transferred to the gate layer and the dielectric layer by an acceptable etching technique to form gate electrode 68 and gate dielectric 66, respectively. The gate electrode 68 and the gate dielectric 66 cover respective channel regions of the semiconductor fins 64. The gate electrode 68 may also have a lengthwise direction substantially perpendicular to the lengthwise direction of respective semiconductor fins 64.

The gate dielectric 66 is shown to be formed over the fins 64 (e.g., over top surfaces and sidewalls of the fins 64) and over the STI regions 62 in the example of FIG. 5. In other embodiments, the gate dielectric 66 may be formed by, e.g., thermal oxidization of a material of the fins 64, and therefore, may be formed over the fins 64 but not over the STI regions 62. These and other variations are fully intended to be included within the scope of the present disclosure.

Figure 6:
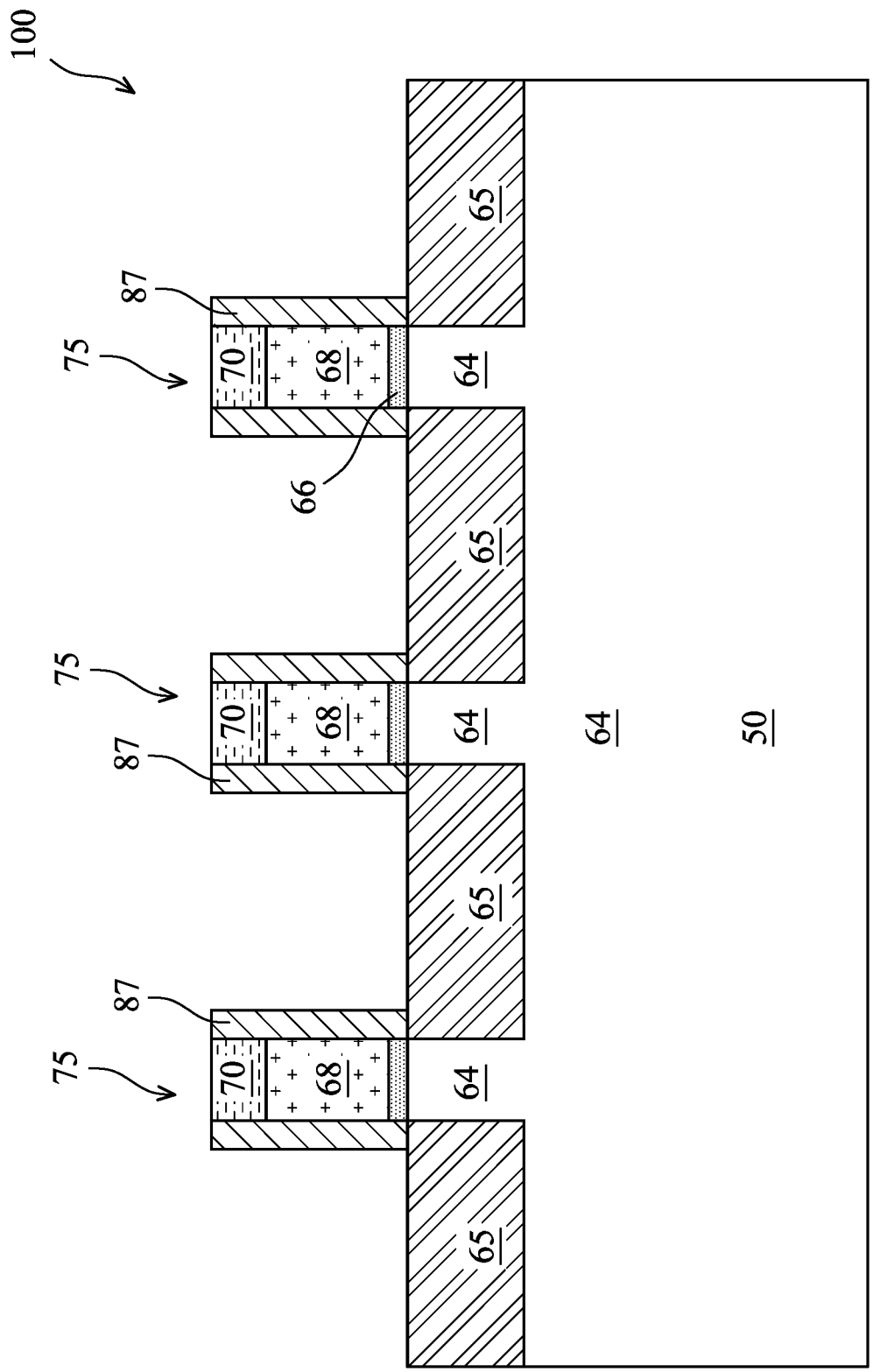

Next, as illustrated in FIG. 6, lightly doped drain (LDD) regions 65 are formed in the fins 64. The LDD regions 65 may be formed by an implantation process. The implantation process may implant n-type or p-type impurities in the fins 64 to form the LDD regions 65. In some embodiments, the LDD regions 65 abut the channel region of the FinFET device 100. Portions of the LDD regions 65 may extend under gate electrode 68 and into the channel region of the FinFET device 100. FIG. 6 illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed.

Still referring to FIG. 6, after the LDD regions 65 are formed, gate spacers 87 are formed on the gate structure. In the example of FIG. 6, the gate spacers 87 are formed on opposing sidewalls of the gate electrode 68 and on opposing sidewalls of the gate dielectric 66. The gate spacers 87 may be formed of silicon nitride, silicon oxynitride, silicon carbide, silicon carbonitride, the like, or a combination thereof, and may be formed using, e.g., a thermal oxidation, CVD, or other suitable deposition process.

The shapes and formation methods of the gate spacers 87 as illustrated in FIG. 6 are merely non-limiting examples, and other shapes and formation methods are possible. For example, the gate spacers 87 may include first gate spacers (not shown) and second gate spacers (not shown). The first gate spacers may be formed on the opposing sidewalls of the dummy gate structure 75. The second gate spacers may be formed on the first gate spacers, with the first gate spacers disposed between a respective gate structure and the respective second gate spacers. The first gate spacers may have an L-shape in a cross-sectional view. As another example, the gate spacers 87 may be formed after the epitaxial source/drain regions 80 (see FIG. 7A) are formed. In some embodiments, dummy gate spacers are formed on the first gate spacers (not shown) before the epitaxial process of the epitaxial source/drain regions 80 illustrated in FIG. 7A, and the dummy gate spacers are removed and replaced with the second gate spacers after the epitaxial source/drain regions 80 are formed. All such embodiments are fully intended to be included in the scope of the present disclosure.

Figure 7A:
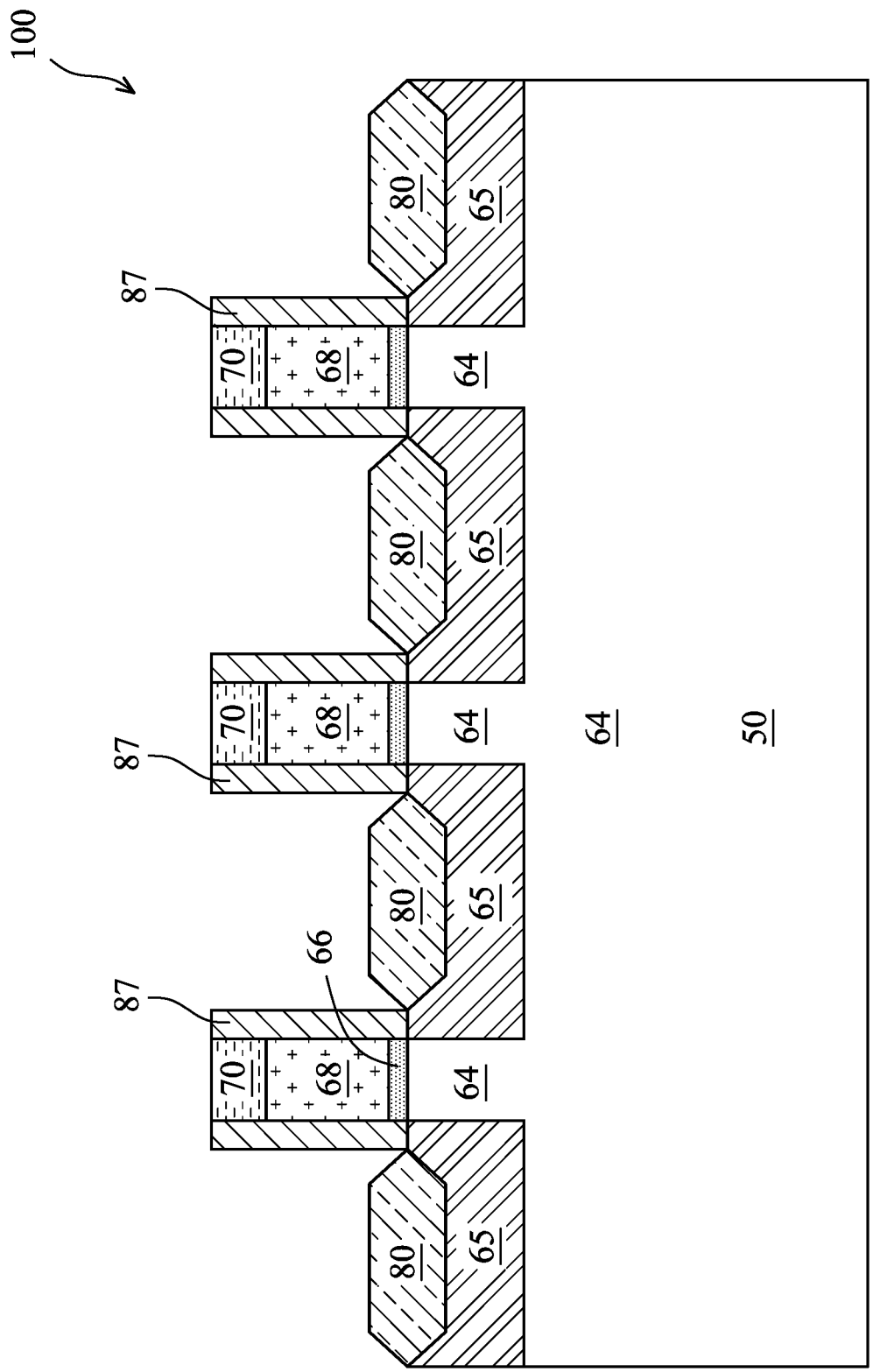
Figure 7B:
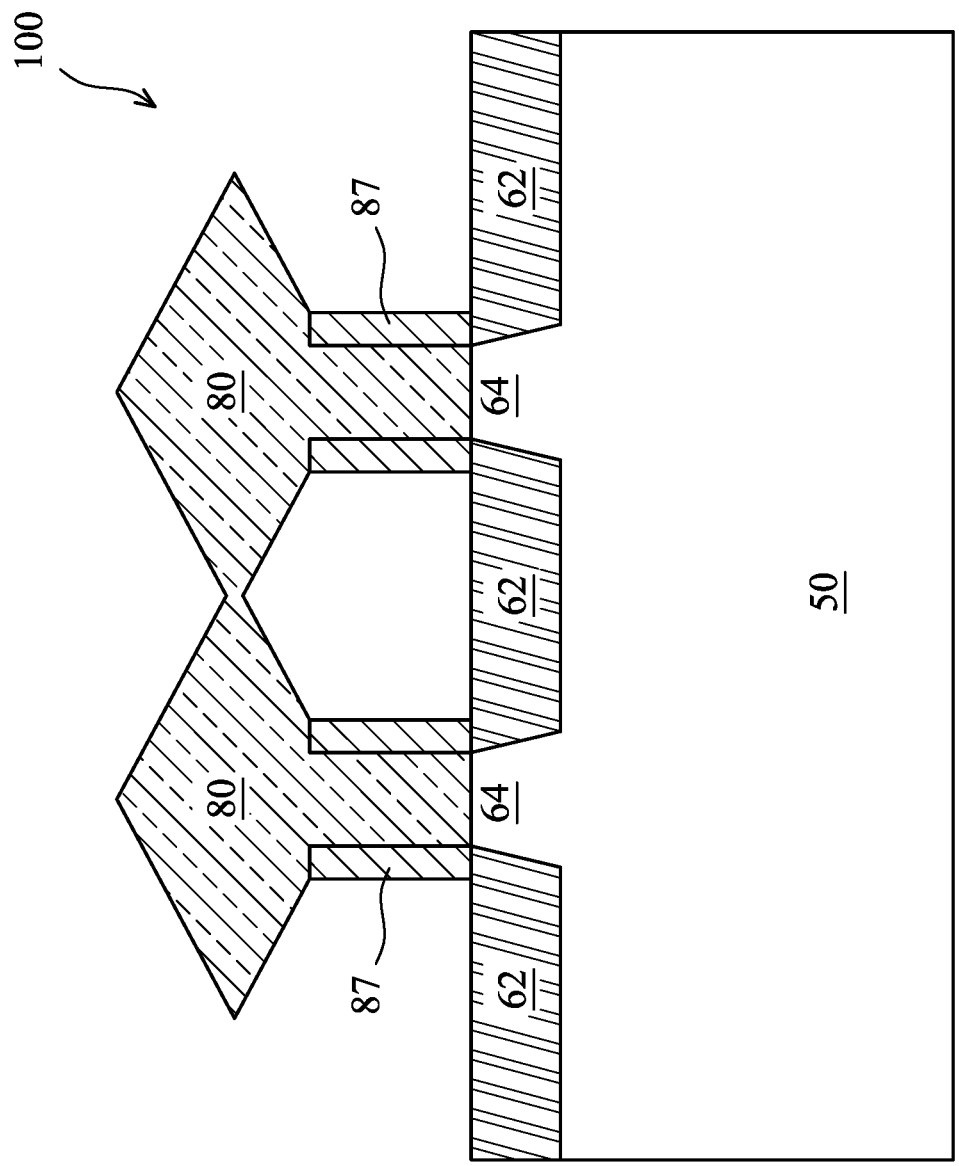
Figure 7C:
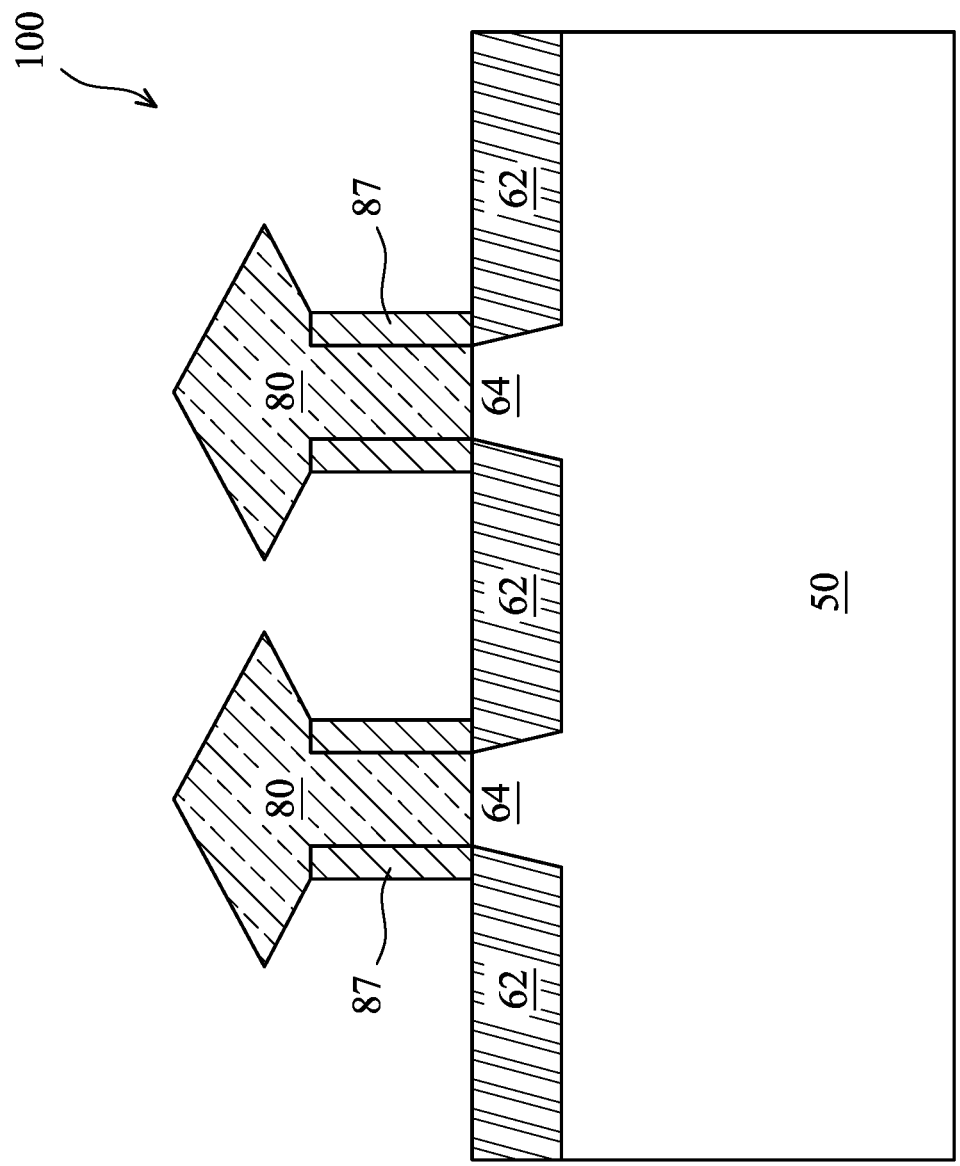

Next, as illustrated in FIG. 7A, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 7A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80, as illustrated in FIG. 7B. In some embodiments, the source/drain regions 80 of adjacent fins 64 do not merge together and remain separate source/drain regions 80, as illustrated in FIG. 7C. In some example embodiments in which the resulting FinFET is an n-type FinFET, source/drain regions 80 comprise silicon carbide (SiC), silicon phosphorous (SiP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. The source/drain regions 80 may have an impurity (e.g., dopant) concentration in a range from about $1E19$ $cm^{-3}$ to about $1E21$ $cm^{-3}$. In some embodiments, the epitaxial source/drain regions may be in situ doped during growth.

Figure 8:
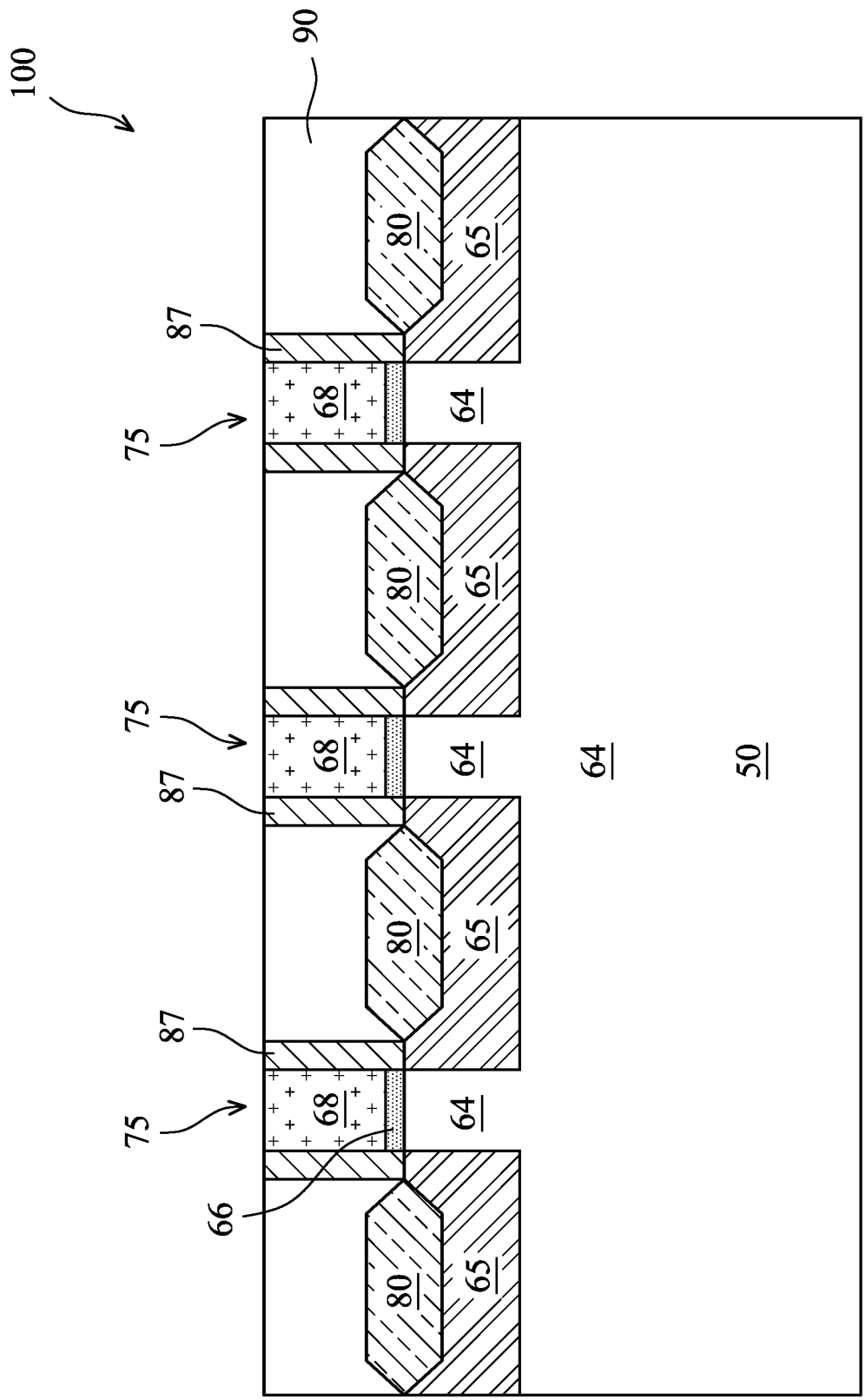

Next, as illustrated in FIG. 8, a first interlayer dielectric (ILD) 90 is formed over the dummy gate structures 75. In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as CMP, may be performed to remove the mask 70. After the planarization process, the top surface of the first ILD 90 is level with the top surface of the gate electrode 68.

Figure 9:
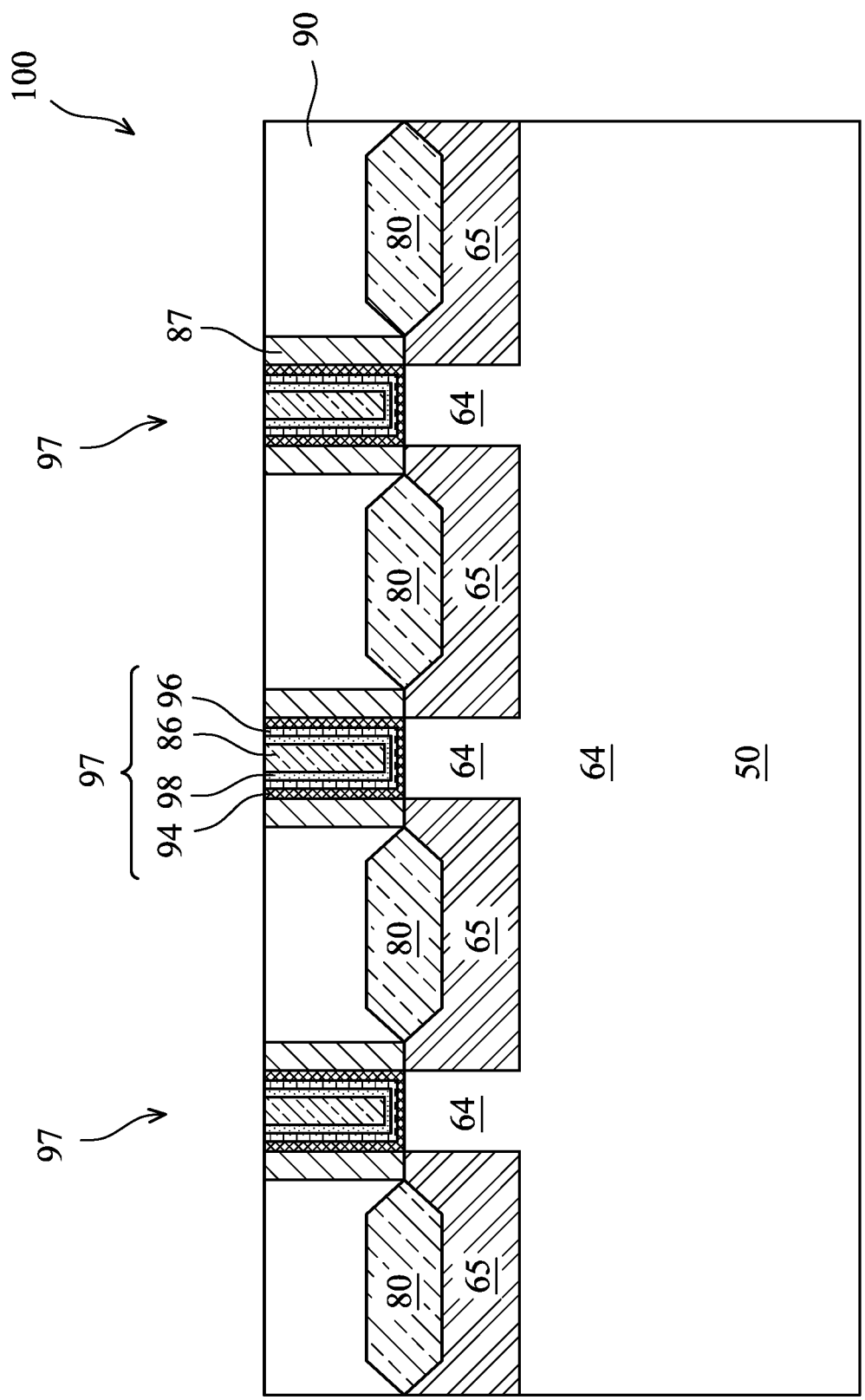

Next, in FIG. 9, a gate-last process (sometimes referred to as replacement gate process) is performed to replace the gate electrode 68 and the gate dielectric 66 with an active gate (may also be referred to as a replacement gate or a metal gate) and active gate dielectric material(s), respectively. Therefore, the gate electrode 68 and the gate dielectric 66 may be referred to as dummy gate electrode and dummy gate dielectric, respectively, in a gate-last process. The active gate is a metal gate, in some embodiments.

Referring to FIG. 9, the dummy gate structures 75 are replaced by replacement gate structures 97. In accordance with some embodiments, to form the replacement gate structures 97, the gate electrode 68 and the gate dielectric 66 directly under the gate electrode 68 are removed in an etching step(s), so that recesses (not shown) are formed between the gate spacers 87. Each recess exposes the channel region of a respective fin 64. During the dummy gate removal, the gate dielectric 66 may be used as an etch stop layer when the gate electrode 68 is etched. The gate dielectric 66 may then be removed after the removal of the gate electrode 68.

Next, a gate dielectric layer 94, a barrier layer 96, a work function layer 98, and a gate electrode 86 are formed in the recesses for the replacement gate structure 97. The gate dielectric layer 94 is deposited conformally in the recesses, such as on the top surfaces and the sidewalls of the fins 64 and on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value (e.g., dielectric constant) greater than about 7.0, and may include a metal oxide or a silicate of Hf, Al, Zr, La, Mg, Ba, Ti, or Pb, or combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98, such as a p-type work function layer or an n-type work function layer, may be formed in the recesses over the barrier layers 96 and before the gate electrode 86 is formed, in some embodiments. Exemplary p-type work function metals that may be included in the gate structures for p-type devices include TiN, TaN, Ru, Mo, Al, WN, $ZrSi_2$, $MoSi_2$, $TaSi_2$, $NiSi_2$, other suitable p-type work function materials, or combinations thereof. Exemplary n-type work function metals that may be included in the gate structures for n-type devices include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the work function layer 98. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 86 is deposited over the seed layer, and fills the remaining portions of the recesses. The gate electrode 86 may be made of a metal-containing material such as Cu, Al, W, the like, combinations thereof, or multi-layers thereof, and may be formed by, e.g., electroplating, electroless plating, or other suitable method. After the formation of the gate electrode 86, a planarization process, such as a CMP, may be performed to remove the excess portions of the gate dielectric layer 94, the barrier layer 96, the work function layer 98, the seed layer, and the gate electrode 86, which excess portions are over the top surface of the first ILD 90. The resulting remaining portions of the gate dielectric layer 94, the barrier layer 96, the work function layer 98, the seed layer, and the gate electrode 86 thus form the replacement gate structure 97 (also referred to as the metal gate structure) of the resulting FinFET device 100. As illustrated in FIG. 9, due to the planarization process, the metal gate structure 97, the gate spacers 87, and the first ILD 90 have a coplanar upper surface.

Figure 10:
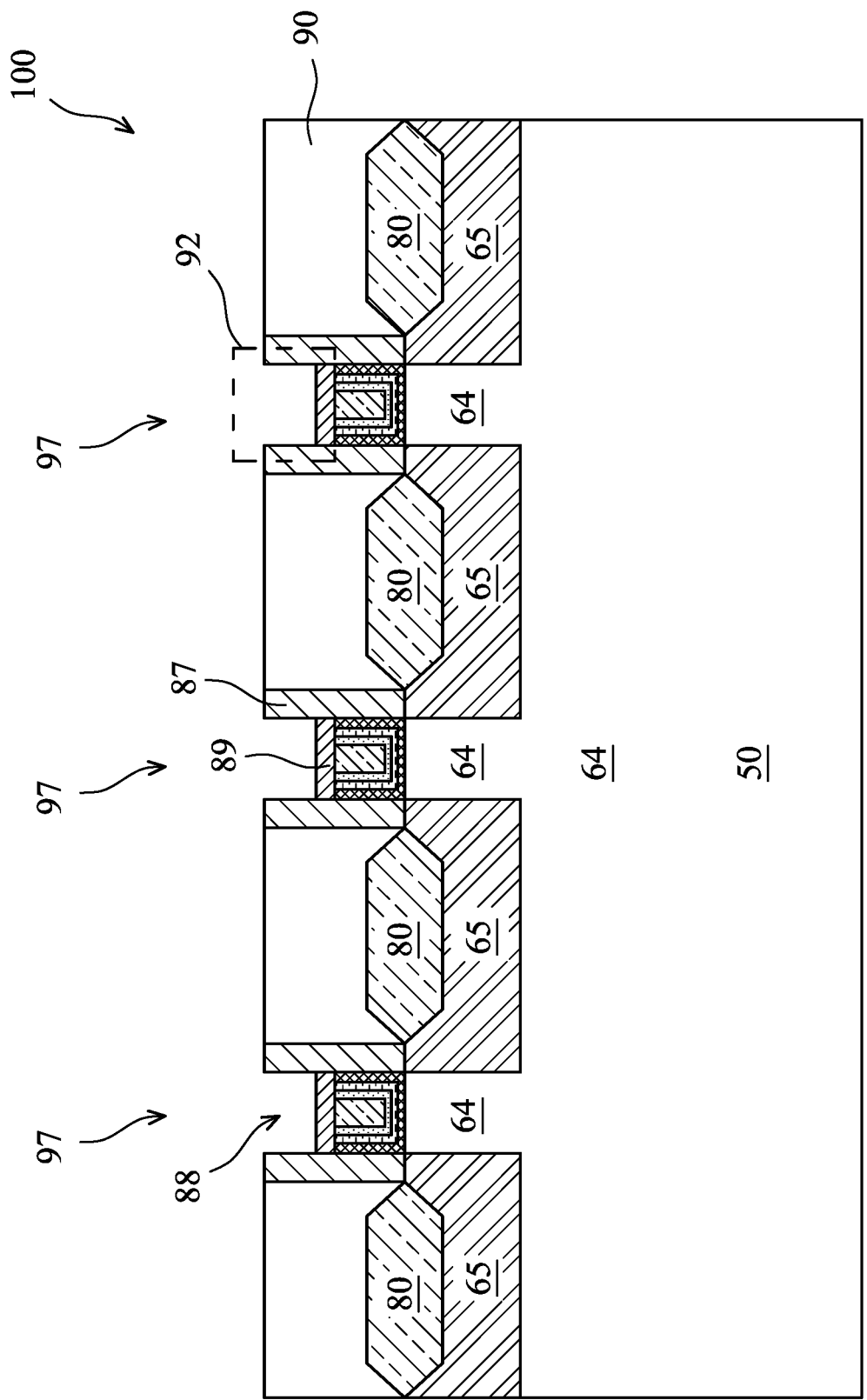

Next, in FIG. 10, a metal gate etch-back process is performed to remove upper portions of the metal gate structures 97, such that the metal gate structures 97 recess below the upper surface of the first ILD 90. Recesses 88 are formed between the gate spacers 87 after the metal gate etch-back process. A suitable etching process, such as dry etch, wet etch, or combinations thereof, may be performed as the metal gate etch-back process. An etchant for the etching process may be a halide (e.g., $CCl_4$), an oxidant (e.g., $O_2$), an acid (e.g., HF), a base (e.g., $NH_3$), an inert gas (e.g., Ar), combinations thereof, or the like, as an example.

Next, a capping layer 89 is formed on the upper surfaces of the metal gate structures 97 to protect the metal gates structures 97, e.g., from oxidization and/or subsequent etching processes. The capping layer 89 is formed of a conductive material (e.g., metal), and is formed selectively on the upper surface of the metal gate structures 97, in the illustrated example. The capping layer 89 may be formed of, e.g., tungsten, although other suitable conductive material may also be used. A suitable formation method, such as CVD, PVD, ALD, or the like, may be used to form the capping layer 89. Note that in the discussion herein, unless otherwise specified, a conductive material refers to an electrically conductive material, and a conductive feature (e.g., a conductive line) refers to an electrically conductive feature.

In subsequent processing, a multi-step deposition process is performed to fill the recesses 88 with a dielectric material 93. The multi-step deposition process comprises one or more deposition-etch cycles, followed by a final deposition step, where each deposition-etch cycle includes a deposition step for depositing a layer of the dielectric material 93, followed by an etching step to etch the deposited dielectric material 93. The final deposition step is performed to fill the remaining portions of the recess 88 after the one or more deposition-etch cycles. Therefore, the multi-step deposition process may also be referred to as a deposition-etch-deposition (DED) process. FIGS. 11-15 illustrate the DED process to fill the recesses 88. Note that for simplicity, FIGS. 11-15 only illustrate an area 92 in FIG. 10, which includes the gate spacers 87, the capping layer 89, and the subsequently formed dielectric material 93.

Figures 11, 12:
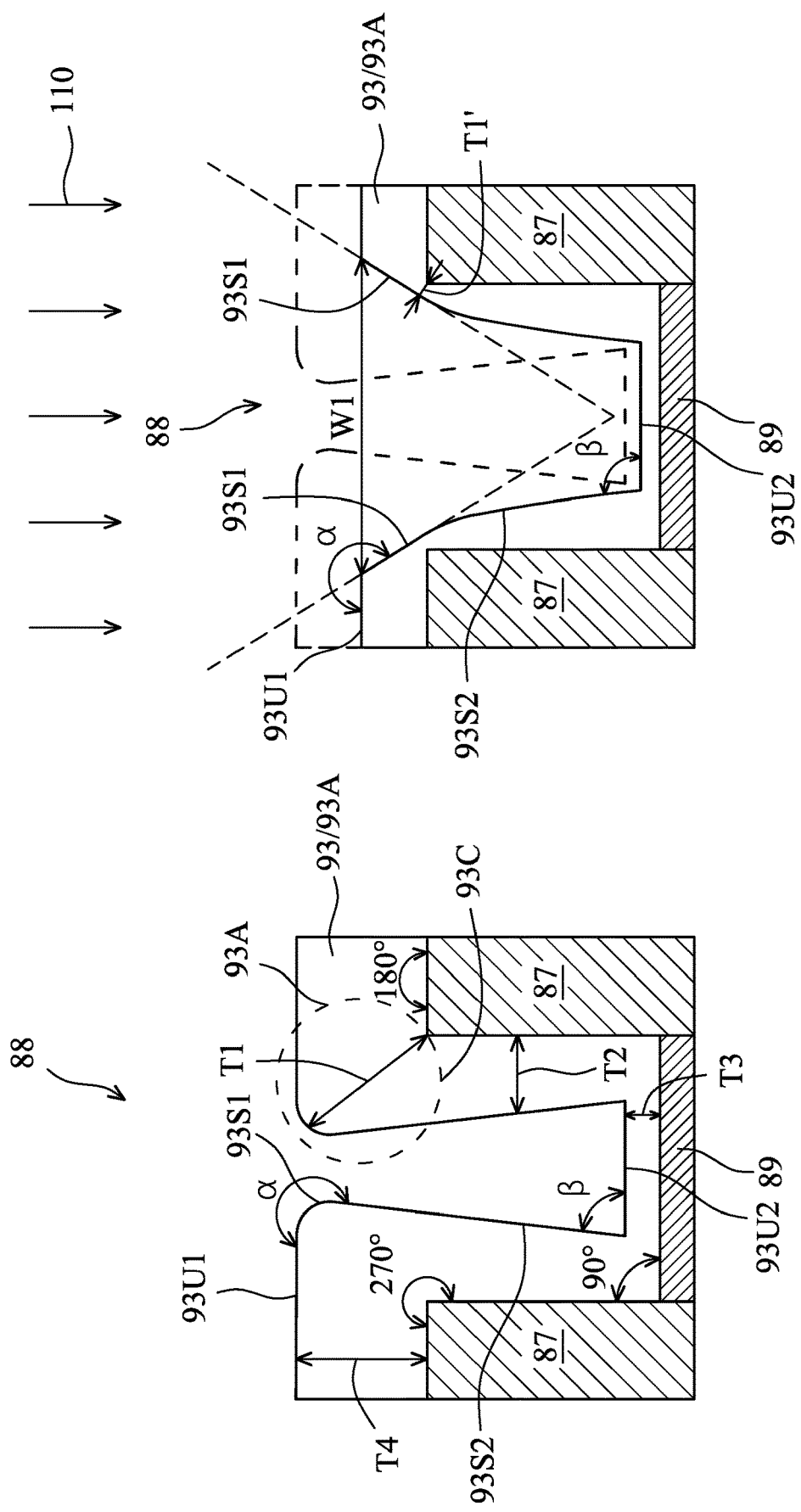

Referring next to FIG. 11, a first layer 93A of the dielectric material 93 is formed in the recess 88 to line the sidewalls and the bottom of the recess 88. Although not shown, the first layer 93A is also formed over the upper surface of the first ILD 90. The dielectric material 93 may be, e.g., silicon nitride, although other suitable dielectric material, such as silicon oxynitride, silicon carbide, silicon carbonitride, or the like, may also be used. The first layer 93A of the dielectric material 93 may be formed by, e.g., high density plasma chemical vapor deposition (HDP-CVD). Other suitable formation method, such as ALD or PECVD, may be used.

In an embodiment, the first layer 93A of the dielectric material 93 is silicon nitride, and is formed by an HDP-CVD process using a process gas comprising silane (e.g., $SiH_4$), nitrogen (e.g., $N_2$), argon (e.g., Ar), and helium (e.g., He). In some embodiments, during the HDP-CVD process, a flow rate of $SiH_4$ gas is between about 1 standard cubic-centimeter per minute (sccm) and about 50 sccm, a flow rate of $N_2$ gas is between about 50 sccm and 1000 sccm, a flow rate of Ar gas is between about 50 sccm and about 600 sccm, and a flow rate of He gas is between about 100 sccm and about 600 sccm. A temperature of the HDP-CVD process may be between about 300° C. and about 500° C., and a pressure of the HDP-CVD process may be between about 0.1 mTorr and about 100 mTorr. A power of the radio frequency (RF) source, used in the HDP-CVD process for igniting the process gas into plasmas, may be between about 500 W and about 8000 W.

Still referring to FIG. 11, after being formed, the first layer 93A of the dielectric material 93 is not a uniform layer. In other words, the first layer 93A has different thicknesses at different locations. For example, a corner portion 93C of the first layer 93A, which is located at the top corner of the gate spacer 87 facing (e.g., exposed by) the recess 88, has a thickness T1, which thickness T1 is larger than a thickness T2 of a sidewall portion of the first layer 93A disposed on the sidewall of the gate spacer 87. In addition, the thickness T1 is also larger than a thickness T3 of a bottom portion of the first layer 93A at the bottom of the recess 88, and larger than a thickness T4 of a top portion of the first layer 93A on the upper surface of the gate spacer 87.

Without being limited to a particular theory, it is believed that the deposition rate of the deposition process (e.g., HDP-CVD) at a particular location is related to (e.g., proportional to) the angle of arrival for the atoms or plasmas of the processing gas. For example, the upper surface of the gate spacer 87 is flat and has a 180° angle of arrival, and the bottom corner of the recess 88 has a right angle and has a 90° angle of arrival. Note that at the top corner of the gate spacer 87, the upper surface of the gate spacer 87 and the sidewall of the gate spacer 87 form a reflex angle (e.g., an angle larger than 180° and smaller than 360°), and has a 270° angle of arrival. As a result, the corner portions 93C of the first layer 93A of the dielectric material 93 have a higher deposition rate than other portions of the first layer 93A, and form overhangs at the top corners of the gate spacers 87. If a single-step deposition process is used to fill the recess 88 with the dielectric material 93, the corner portions 93C may merge earlier than the sidewall portions of the dielectric material 93, thereby sealing an air gap (also referred to as a seam) in the recess 88 between the gate spacers 87. In other words, the dielectric material 93 may not completely fill the recess 88, and may seal an air gap between the gate spacers 87. The air gap in the dielectric material 93 may cause product defect in subsequent processing. The present disclosure, by using the multi-step deposition-etch-deposition (DED) process to fill the recesses 88, prevents the air gaps from being formed, details of which are described hereinafter.

In the example of FIG. 11, an upper surface 93U1 of the first layer 93A and an upper sidewall 93S1 of the first layer 93A form a reflex angle α, which may be between, e.g., 250° and 270°. A bottom surface 93U2 of the first layer 93A and a lower sidewall 93S2 of the first layer 93A form an angle β, which may be between, e.g., 45° and 90°. Note that due to the uneven deposition rate at different locations of the recess 88, the sidewall of the first layer 93A does not have a linear profile, and instead, may have a curved shape.

Next, in FIG. 12, an etching process 110 is performed to remove exterior portions (e.g., portions distal from the gate spacers 87 and from the capping layer 89) of the first layer 93A of the dielectric material 93. For comparison purpose, surfaces (e.g., upper surfaces, sidewalls, and the bottom surface) of the first layer 93A in FIG. 11 are illustrated in dashed line in FIG. 12.

In some embodiments, the etching process 110 is a dry etch process, such as a plasma etching process. In an example embodiment, the etching process 110 is a plasma etching process performed using an etching gas comprising nitrogen trifluoride (e.g., $NF_3$). During the plasma etching process, a flow rate of $NF_3$ gas may be between about 10 sccm and about 100 sccm. A temperature of the plasma etching process may be between about 300° C. and about 500° C. A pressure of the plasma etching process may be between about 0.1 mTorr and about 100 mTorr. A power of the RF source of the plasma etching process may be between about 500 W and about 8000 W. The etching process 110 etches, and/or sputters away, exterior portions of the first layer 93A of the dielectric material 93, in some embodiments.

In the illustrated embodiment, the etching process 110 has a non-uniform etch rate for the first layer 93A of the dielectric material 93. For example, locations of the first layer 93A having large angle of arrival for the atoms or plasmas of the etching gas have a higher etch rate than locations having small angle of arrival. As a result, the corner portions of the first layer 93A are removed at a higher etch rate than other portions of the first layer 93A. In the illustrated example of FIG. 12, the thickness of the corner portion of the first layer 93A is reduced more than those of the top portions, the sidewall portions, and the bottom portions of the first layer 93A. The thickness of the corner portion of the first layer 93 after the etching process 110 is labeled as T1' in in FIG. 12. In FIG. 12, the thickness of the bottom portions of the first layer 93A is reduced the least, due to, e.g., the difficulty of the plasma etching process to reach the bottom of the recess 88.

As illustrated in FIG. 12, after the etching process 110, a width W1 of the recess 88, measured between opposing sidewalls of the dielectric material 93 at the upper surface of the dielectric material 93, is increased compared with that of FIG. 11. Due to the faster removal rate of the corner portions 93C of the dielectric material 93, the angle α between the upper surface 93U1 of the first layer 93A and the upper sidewall 93S1 of the first layer 93A is decreased compared with FIG. 11. The angle α in FIG. 12 may be between, e.g., about 210° and about 230°. In some embodiments, the angle β between the bottom surface 93U2 of the first layer 93A and the lower sidewall 93S2 of the first layer 93A is increased by the etching process 110. The angle β in FIG. 12 may be between, e.g., about 90° and about 135°. In some embodiments, after the etching process 110, the opposing upper sidewalls 93S1 of the first layer 93A of the dielectric material 93 form a V-shape, as illustrated by the V-shaped intersecting dashed lines drawn along the upper sidewalls 93S1 in FIG. 12.

The deposition process of the first layer 93A and the etching process 110 to remove upper portions of the first layer 93A may be collectively referred to as a first deposition-etch cycle of the multiple-step deposition process. Additional deposition-etch cycles may be performed, as discussed below.

Figure 13:
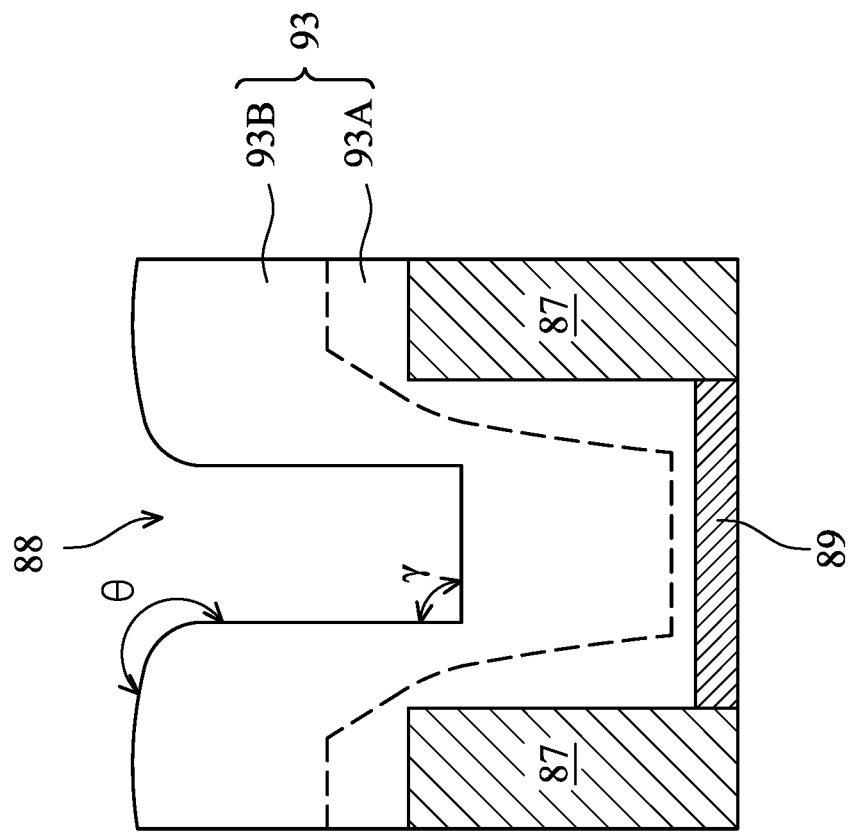

Next, in FIG. 13, a second layer 93B of the dielectric material 93 is formed in the recess 88 and on the first layer 93A. For comparison purpose, the surfaces (e.g., upper surfaces, sidewalls, and the bottom surface) of the first layer 93A in FIG. 12 are illustrated in dashed line in FIG. 13. There may or may not be an interface between the first layer 93A and the second layer 93B of the dielectric material 93. The second layer 93B may be formed using a same or similar formation method as the first layer 93A, thus details are not repeated. For similar reasons as discussed above, corner portions of the second layer 93B may have a larger thickness than other portions of the second layer 93B. As illustrated in FIG. 13, the upper surface of the second layer 93B and the upper sidewall of the second layer 93B form a reflex angle θ (e.g., around 270°), and the bottom surface of the second layer 93B and the lower sidewall of the second layer 93B form an angle γ (e.g., around 90° C.).

Figure 14:
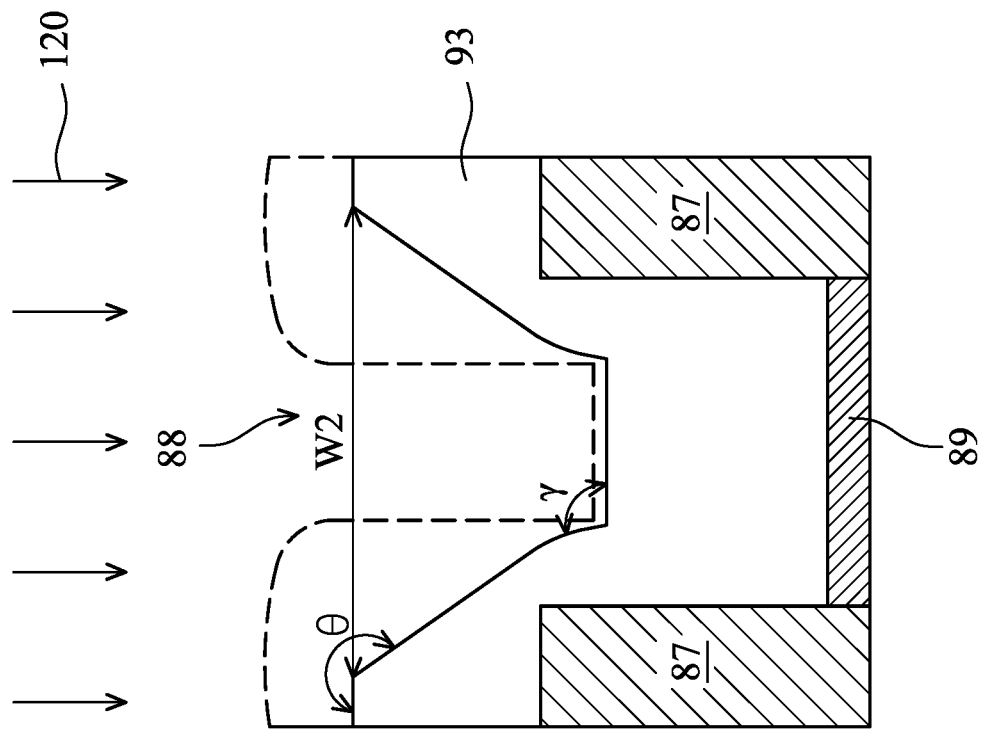

Next, in FIG. 14, an etching process 120 is performed to remove upper portions of the second layer 93B of the dielectric material 93. For comparison purpose, the surfaces (e.g., upper surfaces, sidewalls, and the bottom surface) of the second layer 93B in FIG. 13 are illustrated in dashed line in FIG. 14. The etching process 120 may be the same as or similar to the etching process 110 discussed above, thus details are not repeated. As illustrated in FIG. 14, after the etching process 120, the reflex angle θ is decreased compared with FIG. 13, the angle γ is increased compared with FIG. 13, and a width W2 of the recess 88 is increased compared with FIG. 13.

The deposition process of the second layer 93B and the etching process 120 to remove upper portions of the second layer 93B may be collectively referred to as a second deposition-etch cycle of the multiple-step deposition process. Additional deposition-etch cycles may be performed in the same or similar way, depending on, e.g., the dimension of the recesses 88, as skilled artisans readily appreciate.

Figure 15:
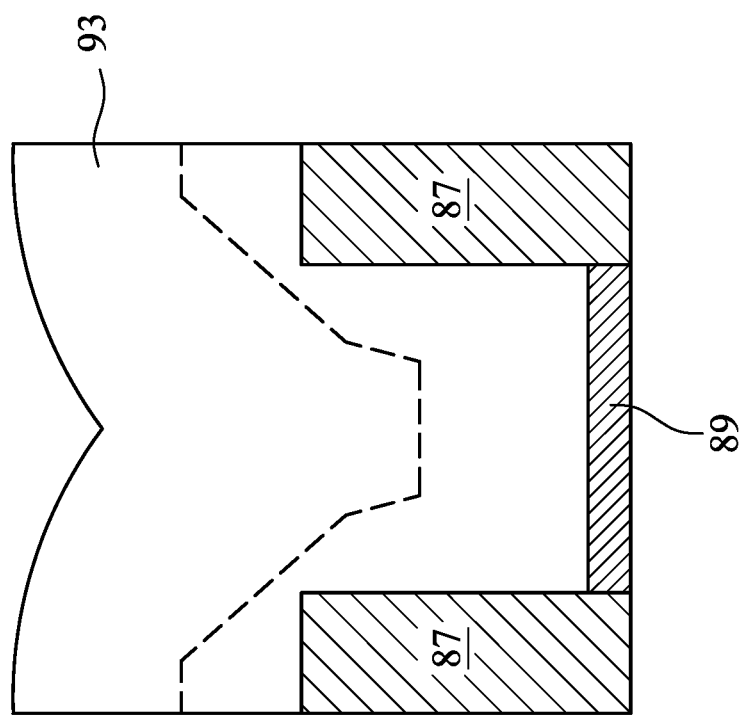

After one or more deposition-etch cycles are performed, the depth of the recess 88 may be shallow enough, and/or the width (e.g., W2) of the recess 88 may be wide enough, such that a final deposition process could be performed to completely fill/overfill the recess 88 without an air gap in the dielectric material 93. FIG. 15 illustrates the final deposition step of the multi-step deposition process, where a deposition process same as or similar to that for forming the first layer 93A is performed to fill/overfill the recess 88. Therefore, the recess 88 is now completely filled with the dielectric material 93, and no air gap is formed in the dielectric material 93 between the gate spacers 87.

Figure 16:
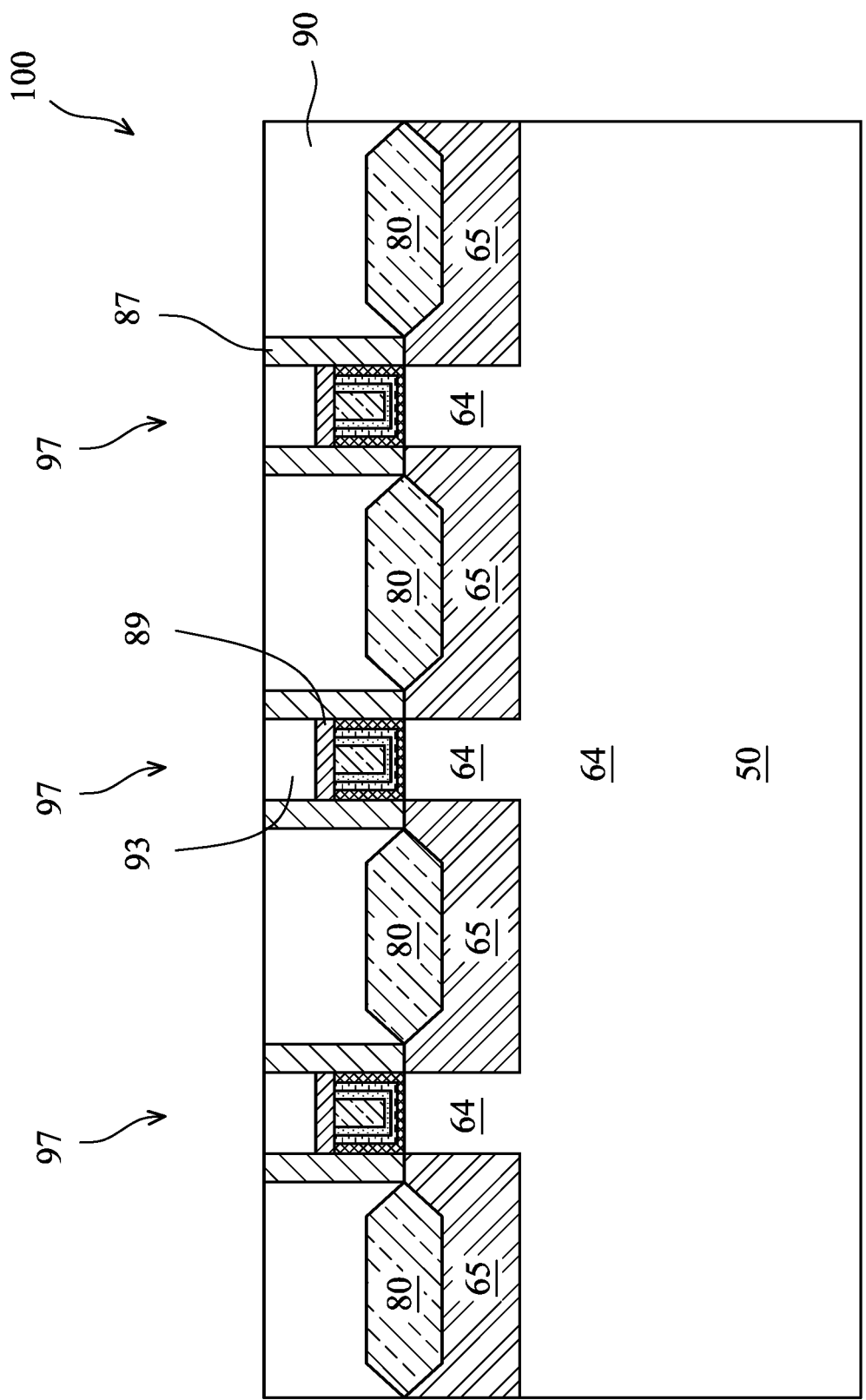

Next, in FIG. 16, a planarization process, such as CMP, is performed to remove excess portions of the dielectric material 93 from the upper surface of the first ILD 90. After the planarization process, the first ILD 90, the gate spacer 87, and the dielectric material 93 have a co-planar upper surface.

Figure 17:
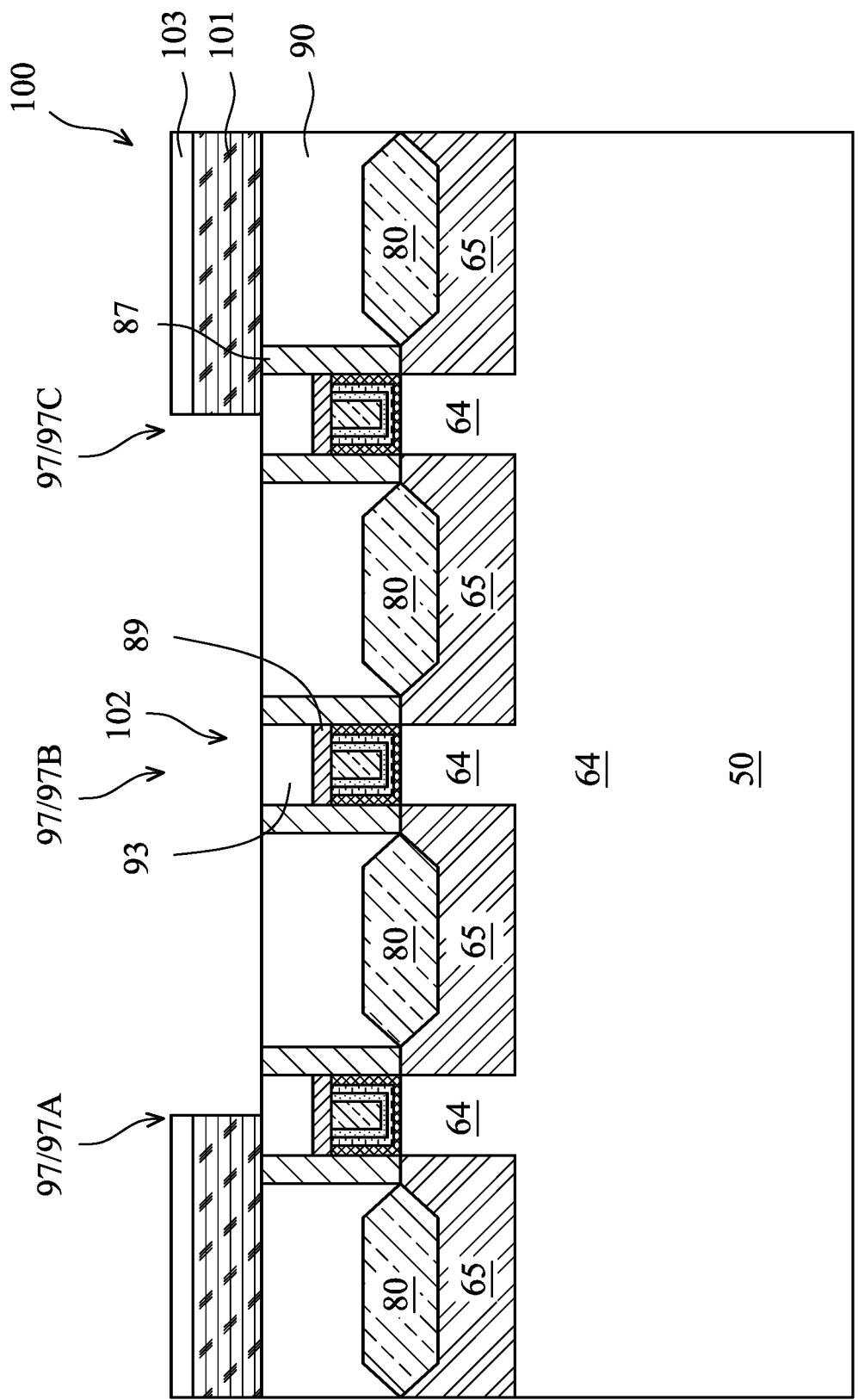
Figure 18:
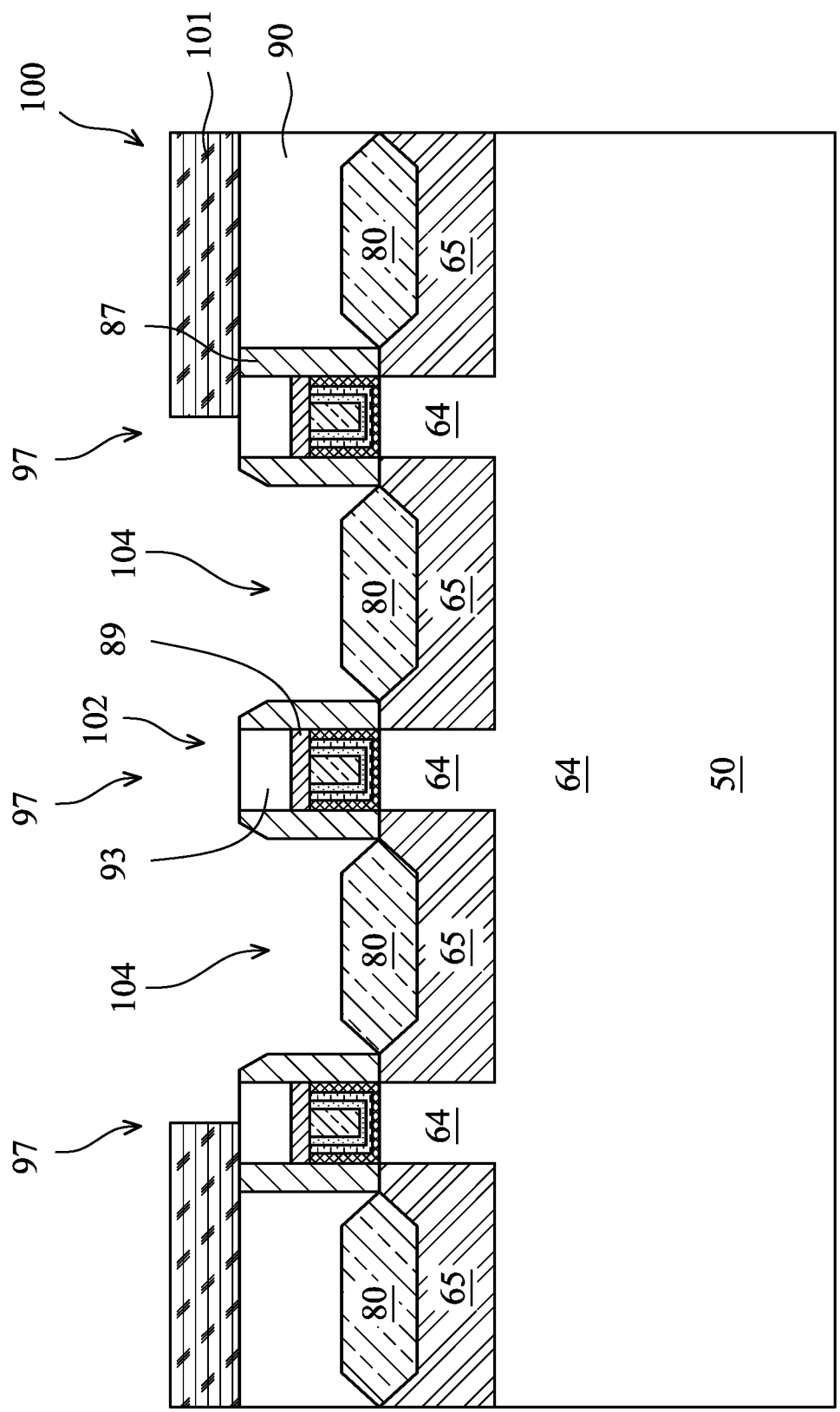
Figure 19:
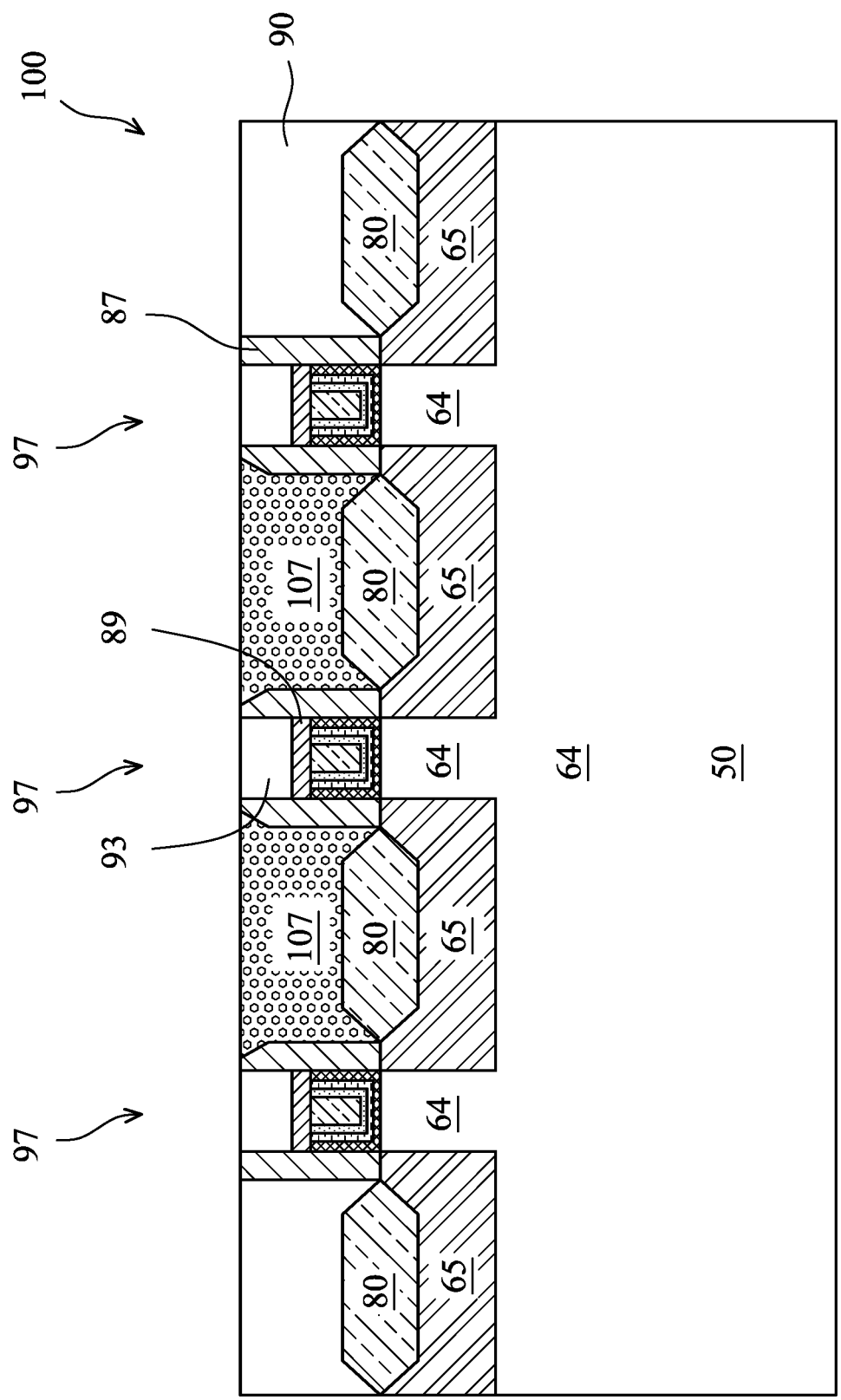

FIGS. 17-19 illustrate the formation of self-aligned source/drain contacts 107. Referring to FIG. 17, a patterned mask layer 101 is formed over the first ILD 90. The patterned mask layer 101 may be formed by: forming a photoresist layer 101 over the first ILD 90, forming a hard mask layer 103 over the photoresist layer 101, patterning the hard mask layer 103, and transferring the pattern of the hard mask layer 103 to the photoresist layer 101. The patterned photoresist layer 101 forms the patterned mask layer 101. As illustrated in FIG. 17, an opening 102 of the patterned mask layer 101 exposes portions of the dielectric material 93, some of the gate spacers 87, and portions of the first ILD 90.

Next, in FIG. 18, an etching process, such as an anisotropic etching process, is performed using the patterned mask layer 101 as an etching mask. The etching process removes the portions of the first ILD 90 underlying the opening 102, and exposes the source/drain regions 80. The etching process may also remove the hard mask layer 103. In some embodiments, the etchant of the etching process is selective to (e.g., having a higher etch rate for) the material of the first ILD 90, such that the exposed portions of the first ILD 90 are removed without substantially attacking other structures (e.g., 87, 93) of the FinFET device 100. After the etching process, openings 104 are formed in the first ILD 90 that expose the underlying source/drain regions 80.

Next, in preparation for forming the source/drain contacts in the openings 104, a cleaning process is performed to clean the openings 104, e.g., by removing residues left by the previous processing steps (e.g., the etching process to form the openings 104). The cleaning process may be, e.g., a suitable wet etch process or a dry etch process.

Next, in FIG. 19, a conductive material, such as Cu, Al, W, combinations thereof, or the like, is formed in the openings 104 to fill the openings 104. Next, a planarization process, such as CMP, is performed to remove excess portions of the conductive material from the upper surface of the first ILD 90. After the planarization process, the remaining portions of the conductive material in the openings 104 form self-aligned source/drain contacts 107.

Figure 20:
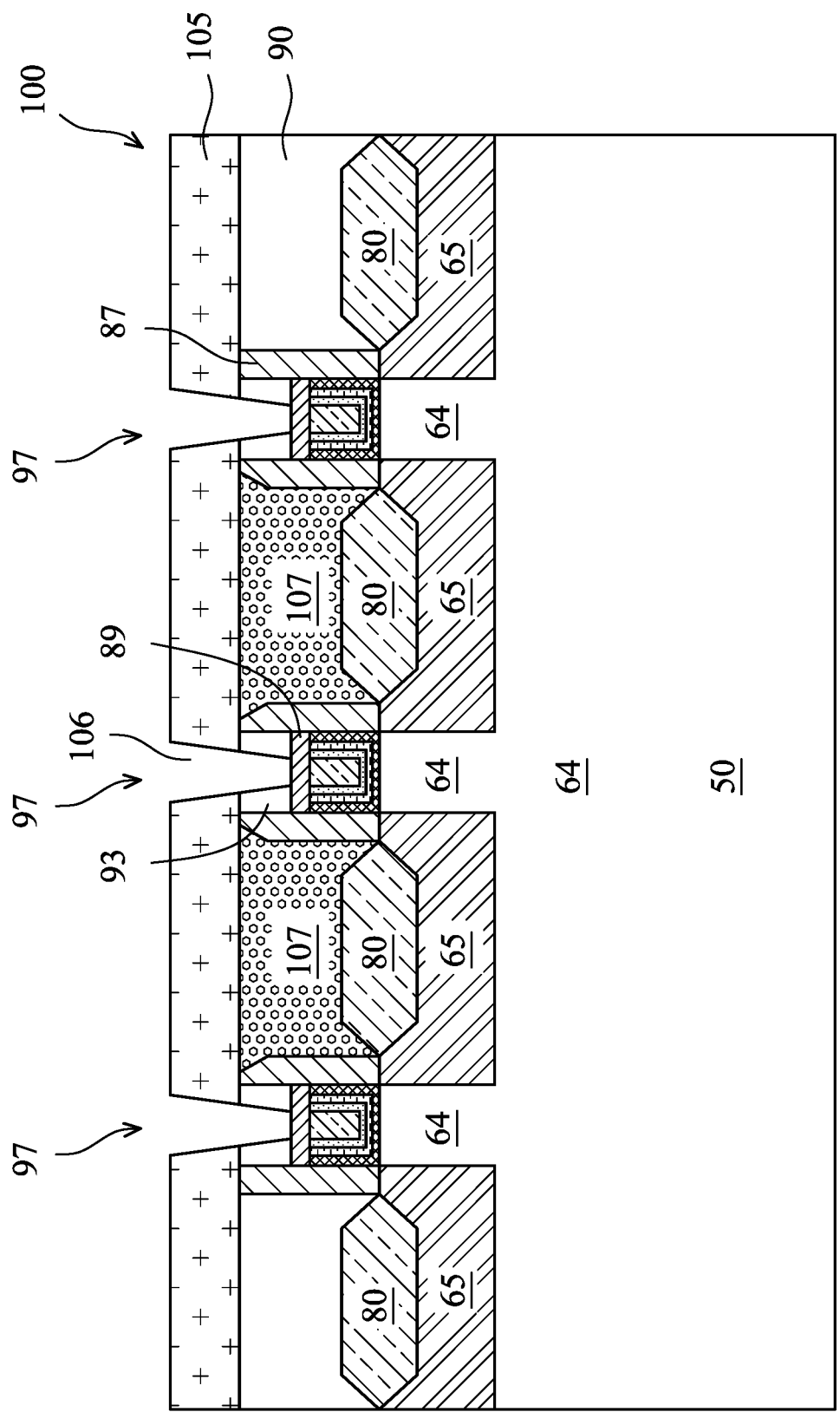

Next, in FIG. 20, a second ILD 105 is formed over the first ILD 90. Openings 106 are formed that extend through the second ILD 105 and the dielectric material 93 to expose the capping layer 89 on the metal gate structures 97. The second ILD 105 may be formed of a same or similar material as the first ILD 90 using a same or similar formation method, thus details are not repeated. The openings 106 may be formed using, e.g., photolithography and etching techniques.

Figure 21:
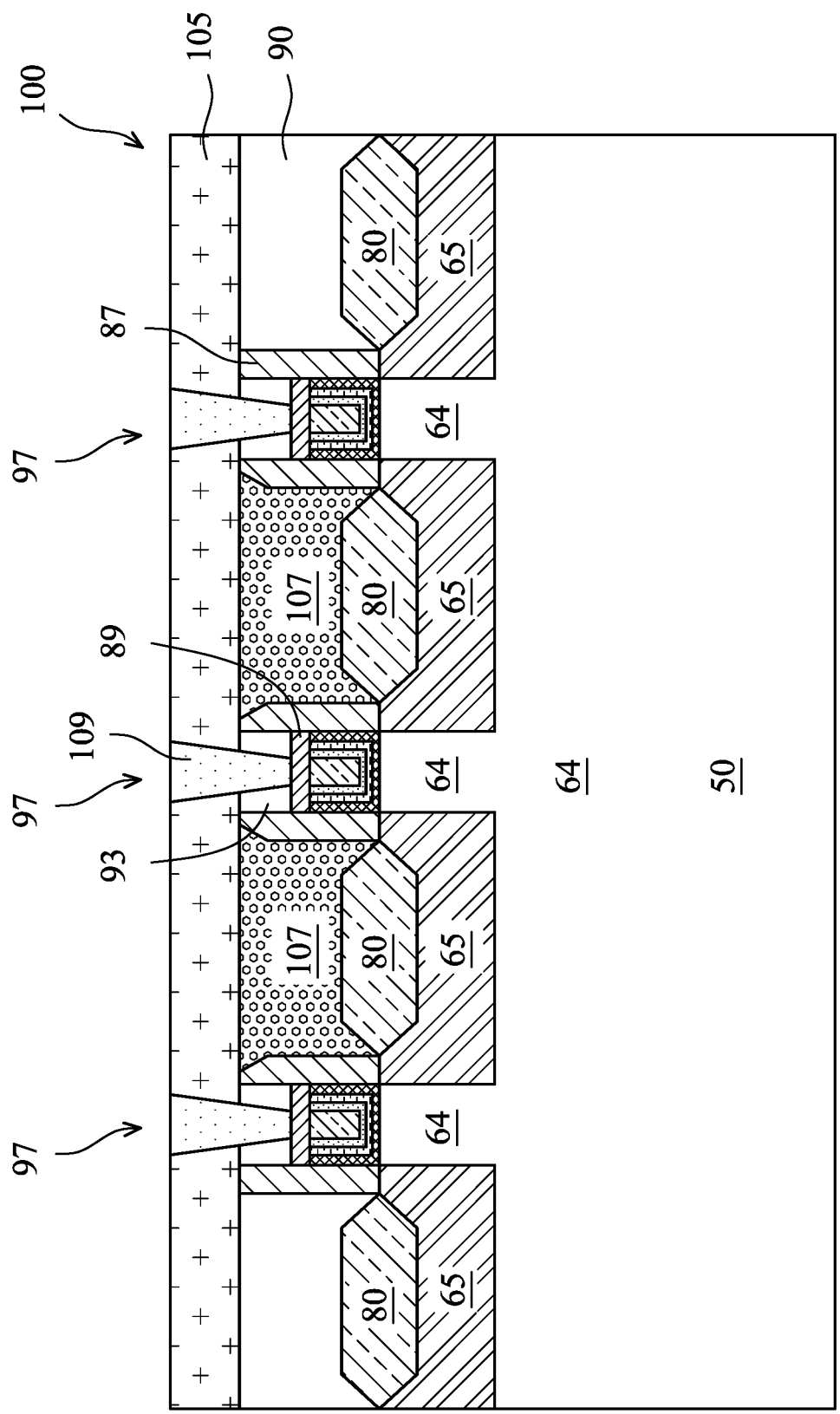

Next, in FIG. 21, gate contacts 109 are formed in the openings 106 to electrically couple to the metal gate structures 97. The gate contacts 109 may be formed by filling the openings 106 with a conductive material (e.g., Cu, W, Co, the like, or combinations thereof), and removing excess portions of the conductive material from the upper surface of the second ILD 105.

Additional processing may follow the processing of FIG. 21 to complete the fabrication of the FinFET device 100. For example, an interconnect structure, which includes a plurality of dielectric layers and conductive features (e.g., vias, conductive lines) in the dielectric layers, is formed over the structure of FIG. 21 to interconnect the electrical components to form functional circuits. Details are not discussed here.

Advantages of the present disclosure are now discussed in more detail. Recall that the multi-step deposition process to form the dielectric material 93 prevents air gaps from being formed. Without the presently disclosed method, air gaps, or seams, may be formed in the dielectric material 93 over the metal gate structures 97. The seams may adversely affect the physical properties of the dielectric material 93, e.g., by lowering its hardness, etching resistance, and so on. The planarization process, performed after the recesses 88 are filled with the dielectric material 93, may expose the seams. During the cleaning process for the openings 104, the etchant used in the cleaning process may enter the seams and may remove portions of the dielectric material 93 adjacent to the seams, due to the weakened physical properties. As a result, divots (e.g., recessed areas) may be formed at the upper surfaces of the dielectric material 93, which divots may be connected to the underling seams. During the formation of the self-aligned source/drain contacts 107, the conductive material of the source/drain contacts 107 may fill the divots at the upper surface of the dielectric material 93. The conductive material may also fill the seams in the dielectric material 93. Note that these portions of the conductive material are not removed by the CMP process and remain embedded in the dielectric material 93. In the subsequent process to form the openings 106 for the gate contacts 109, the portions of the conductive material embedded in the dielectric material 93 may interfere with (e.g., block) the etching process, and may stop the etching for the openings 106 prematurely, thus the openings 106 may not reach (e.g., expose) the capping layer 89 on the metal gate structures 97. As a result, the subsequently formed gate contacts 109 may not be electrically coupled to the underlying metal gate structures 97, thereby causing product defect. The presently disclosed method, by preventing the seams from being formed in the dielectric material 93, prevents or reduces of the occurrence of the product defect as described above, thereby improving device reliability and production yield.

Figure 22:
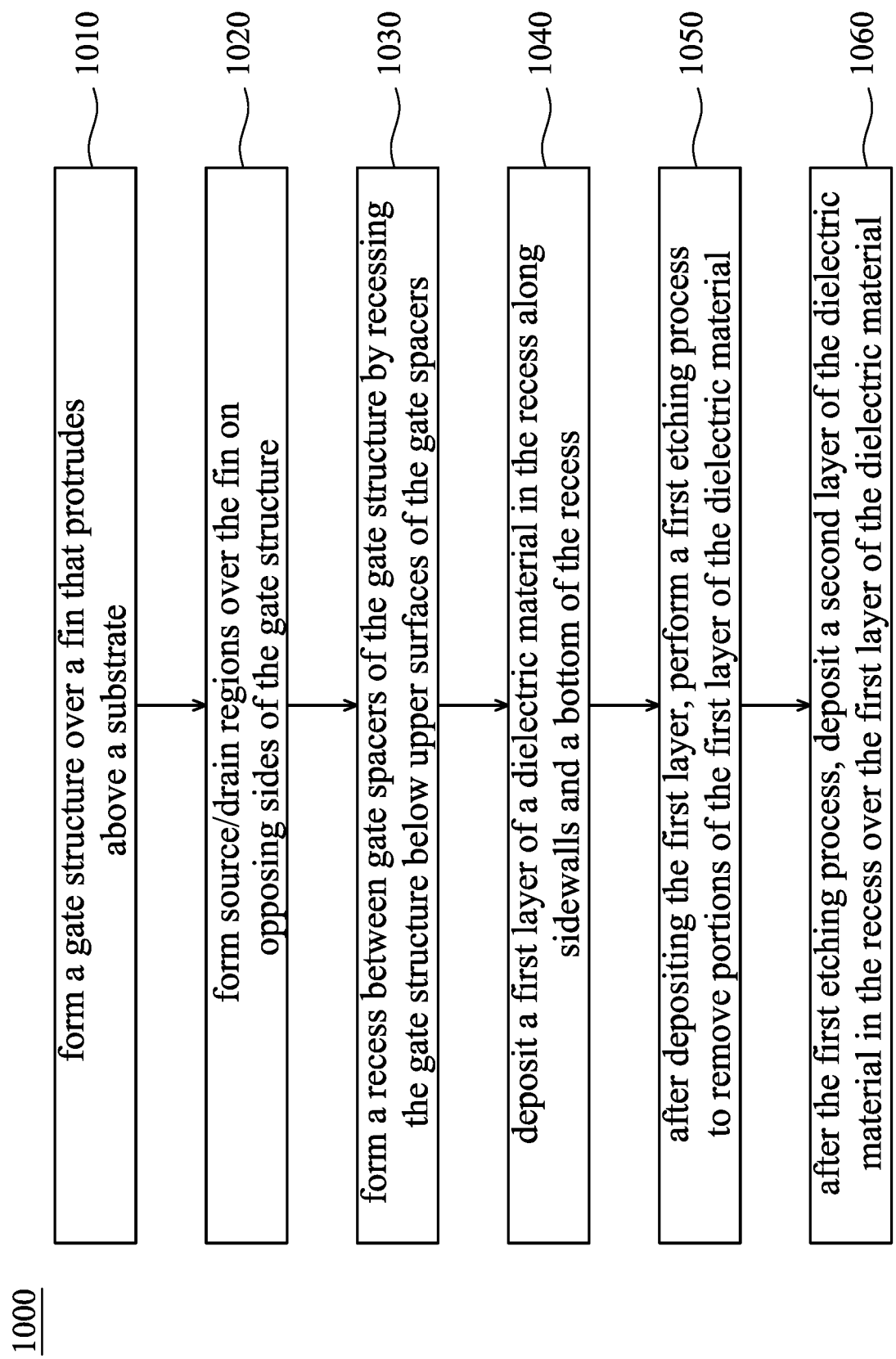
FIG. 22 illustrates a flow chart of a method of fabricating a semiconductor device, in accordance with some embodiments.

FIG. 22 illustrates a flow chart of a method 1000 of forming a semiconductor device, in accordance with some embodiments. It should be understood that the embodiment method shown in FIG. 22 is merely an example of many possible embodiment methods. One of ordinary skill in the art would recognize many variations, alternatives, and modifications. For example, various steps as illustrated in FIG. 22 may be added, removed, replaced, rearranged and repeated.

Referring to FIG. 22, at block 1010, a gate structure is formed over a fin that protrudes above a substrate. At block 1020, source/drain regions are formed over the fin on opposing sides of the gate structure. At block 1030, a recess is formed between gate spacers of the gate structure by recessing the gate structure below upper surfaces of the gate spacers. At block 1040, a first layer of a dielectric material is deposited in the recess along sidewalls and a bottom of the recess. At block 1050, after depositing the first layer, a first etching process is performed to remove portions of the first layer of the dielectric material. At block 1060, after the first etching process, a second layer of the dielectric material is deposited in the recess over the first layer of the dielectric material.

In an embodiment, a method of forming a semiconductor device includes: forming a gate structure over a fin that protrudes above a substrate; forming source/drain regions over the fin on opposing sides of the gate structure; forming a recess between gate spacers of the gate structure by recessing the gate structure below upper surfaces of the gate spacers; depositing a first layer of a dielectric material in the recess along sidewalls and a bottom of the recess; after depositing the first layer, performing a first etching process to remove portions of the first layer of the dielectric material; and after the first etching process, depositing a second layer of the dielectric material in the recess over the first layer of the dielectric material. In an embodiment, the method further includes: after depositing the second layer, performing a second etching process to remove portions of the second layer of the dielectric material; and after the second etching process, depositing a third layer of the dielectric material in the recess over the second layer of the dielectric material. In an embodiment, after depositing the first layer and before the first etching process, corners portions of the first layer of the dielectric material, which are disposed at corners of the gate spacers, have a first thickness larger than thicknesses of other portions of the first layer of the dielectric material. In an embodiment, the first etching process removes the corners portions of the first layer of the dielectric material faster than the other portions of the first layer of the dielectric material. In an embodiment, after the first etching process, sidewalls of the corner portions of the first layer of the dielectric material form a V-shape. In an embodiment, after depositing the first layer and before the first etching process, a width of the recess, measured between opposing sidewalls of the recess at an upper surface of the first layer of the dielectric material, has a first value, wherein after the first etching process, the width of the recess has a second value larger than the first value. In an embodiment, after depositing the first layer and before the first etching process, a first angle between an upper surface of the first layer of the dielectric material and a sidewall of the first layer of the dielectric material has a first value, wherein after the first etching process, the first angle has a second value smaller than the first value. In an embodiment, after depositing the first layer and before the first etching process, a second angle between the sidewall of the first layer of the dielectric material and a bottom surface of the first layer of the dielectric material has a third value, wherein after the first etching process, the second angle has a fourth value larger than the third value. In an embodiment, depositing the first layer comprises depositing the first layer of the dielectric material using high density plasma chemical vapor deposition (HDP-CVD). In an embodiment, the first etching process is a plasma etching process. In an embodiment, the method further includes: before forming the recess, forming an inter-layer dielectric (ILD) layer over the source/drain regions around the gate structure; after depositing the second layer, forming a patterned mask layer over the ILD layer, wherein a first opening in the patterned mask layer exposes the dielectric material over the recessed gate structure, exposes the gate spacers, and exposes first portions of the ILD layer directly over the source/drain regions; performing an anisotropic etching process using the patterned mask layer as an etching mask, wherein the anisotropic etching process removes the first portions of the ILD layer to form a second opening in the ILD layer that exposes the source/drain regions; and filling the second opening with an electrically conductive material. In an embodiment, the method further includes, after performing the anisotropic etching process and before the filling, cleaning the second opening using an etchant.

In an embodiment, a method of forming a semiconductor device includes: forming a gate structure over a fin that protrudes above a substrate; forming gate spacers along sidewalls of the gate structure; forming an inter-layer dielectric (ILD) layer over the fin around the gate spacers; recessing the gate structure below an upper surface of the ILD layer to form a recess between the gate spacers; lining sidewalls and a bottom of the recess with a first layer of a dielectric material, wherein corner portions of the first layer of the dielectric material, which are disposed at corners of the gate spacers, are thicker than sidewall portions of the first layer of the dielectric material disposed along sidewalls of the gate spacers; performing a first etching process to remove exterior portions of the first layer of the dielectric material, wherein the first etching process removes the corner portions faster than the sidewall portions; and after performing the first etching process, depositing a second layer of the dielectric material in the recess over the first layer of the dielectric material. In an embodiment, the first etching process also removes the corner portions faster than bottom portions of the first layer of the dielectric material disposed at the bottom of the recess. In an embodiment, the first etching process decreases a first reflex angle between an upper surface of the first layer of the dielectric material distal from the substrate and a sidewall of the first layer of the dielectric material. In an embodiment, the first etching process increases a second angle between the sidewall of the first layer of the dielectric material and a bottom surface of the first layer of the dielectric material that extends along the bottom of the recess. In an embodiment, the method further includes, after the recessing and before the lining, forming an electrically conductive capping layer on the recessed gate structure.

In an embodiment, a method of forming a semiconductor device includes: forming a gate structure over a fin that protrudes above a substrate; forming gate spacers along sidewalls of the gate structure; forming an inter-layer dielectric (ILD) layer over the fin around the gate spacers; forming a recess between the gate spacers by recessing the gate structure below an upper surface of the ILD layer; lining sidewalls and a bottom of the recess with a dielectric material by performing one or more deposition-etch cycles, wherein performing each of the deposition-etch cycles comprises: depositing a layer of the dielectric material in the recess; and etching the deposited layer of the dielectric material; and after the lining, filling a remaining portion of the recess with the dielectric material. In an embodiment, the etching removes corner portions of the deposited layer of the dielectric material faster than sidewall portions of the deposited layer of the dielectric material, wherein the corner portions are disposed at corners of the gate spacers, and the sidewall portions are disposed along inner sidewalls of gate spacers. In an embodiment, etching the deposited layer of the dielectric material is performed by a plasma etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a gate structure over a fin that protrudes above a substrate;
    forming source/drain regions over the fin on opposing sides of the gate structure;
    forming a recess between gate spacers of the gate structure by recessing the gate structure below upper surfaces of the gate spacers;
    depositing a first layer of a dielectric material in the recess along sidewalls and a bottom of the recess;
    after depositing the first layer, performing a first etching process to remove portions of the first layer of the dielectric material; and
    after the first etching process, depositing a second layer of the dielectric material in the recess over the first layer of the dielectric material.

2. The method of claim 1, further comprising:
    after depositing the second layer, performing a second etching process to remove portions of the second layer of the dielectric material; and
    after the second etching process, depositing a third layer of the dielectric material in the recess over the second layer of the dielectric material.

3. The method of claim 1, wherein after depositing the first layer and before the first etching process, corners portions of the first layer of the dielectric material, which are disposed at corners of the gate spacers, have a first thickness larger than thicknesses of other portions of the first layer of the dielectric material.

4. The method of claim 3, wherein the first etching process removes the corners portions of the first layer of the dielectric material faster than the other portions of the first layer of the dielectric material.

5. The method of claim 4, wherein after the first etching process, sidewalls of the corner portions of the first layer of the dielectric material form a V-shape.

6. The method of claim 1, wherein after depositing the first layer and before the first etching process, a width of the recess, measured between opposing sidewalls of the recess at an upper surface of the first layer of the dielectric material, has a first value, wherein after the first etching process, the width of the recess has a second value larger than the first value.

7. The method of claim 1, wherein after depositing the first layer and before the first etching process, a first angle between an upper surface of the first layer of the dielectric material and a sidewall of the first layer of the dielectric material has a first value, wherein after the first etching process, the first angle has a second value smaller than the first value.

8. The method of claim 7, wherein after depositing the first layer and before the first etching process, a second angle between the sidewall of the first layer of the dielectric material and a bottom surface of the first layer of the dielectric material has a third value, wherein after the first etching process, the second angle has a fourth value larger than the third value.

9. The method of claim 1, wherein depositing the first layer comprises depositing the first layer of the dielectric material using high density plasma chemical vapor deposition (HDP-CVD).

10. The method of claim 9, wherein the first etching process is a plasma etching process.

11. The method of claim 1, further comprising:
before forming the recess, forming an inter-layer dielectric (ILD) layer over the source/drain regions around the gate structure;
after depositing the second layer, forming a patterned mask layer over the ILD layer, wherein a first opening in the patterned mask layer exposes the dielectric material over the recessed gate structure, exposes the gate spacers, and exposes first portions of the ILD layer directly over the source/drain regions;
performing an anisotropic etching process using the patterned mask layer as an etching mask, wherein the anisotropic etching process removes the first portions of the ILD layer to form a second opening in the ILD layer that exposes the source/drain regions; and
filling the second opening with an electrically conductive material.

12. The method of claim 11, further comprising, after performing the anisotropic etching process and before the filling, cleaning the second opening using an etchant.

13. A method of forming a semiconductor device, the method comprising:
forming a gate structure over a fin that protrudes above a substrate;
forming gate spacers along sidewalls of the gate structure;
forming an inter-layer dielectric (ILD) layer over the fin around the gate spacers;
recessing the gate structure below an upper surface of the ILD layer to form a recess between the gate spacers;
lining sidewalls and a bottom of the recess with a first layer of a dielectric material, wherein corner portions of the first layer of the dielectric material, which are disposed at corners of the gate spacers, are thicker than sidewall portions of the first layer of the dielectric material disposed along sidewalls of the gate spacers;
performing a first etching process to remove exterior portions of the first layer of the dielectric material, wherein the first etching process removes the corner portions faster than the sidewall portions; and
after performing the first etching process, depositing a second layer of the dielectric material in the recess over the first layer of the dielectric material.

14. The method of claim 13, wherein the first etching process also removes the corner portions faster than bottom portions of the first layer of the dielectric material disposed at the bottom of the recess.

15. The method of claim 13, wherein the first etching process decreases a first reflex angle between an upper surface of the first layer of the dielectric material distal from the substrate and a sidewall of the first layer of the dielectric material.

16. The method of claim 15, wherein the first etching process increases a second angle between the sidewall of the first layer of the dielectric material and a bottom surface of the first layer of the dielectric material that extends along the bottom of the recess.

17. The method of claim 13, further comprising, after the recessing and before the lining, forming an electrically conductive capping layer on the recessed gate structure.

18. A method of forming a semiconductor device, the method comprising:
forming a gate structure over a fin that protrudes above a substrate;
forming gate spacers along sidewalls of the gate structure;
forming an inter-layer dielectric (ILD) layer over the fin around the gate spacers;
forming a recess between the gate spacers by recessing the gate structure below an upper surface of the ILD layer;
lining sidewalls and a bottom of the recess with a dielectric material by performing one or more deposition-etch cycles, wherein performing each of the deposition-etch cycles comprises:
depositing a layer of the dielectric material in the recess; and
etching the deposited layer of the dielectric material; and
after the lining, filling a remaining portion of the recess with the dielectric material.

19. The method of claim 18, wherein the etching removes corner portions of the deposited layer of the dielectric material faster than sidewall portions of the deposited layer of the dielectric material, wherein the corner portions are disposed at corners of the gate spacers, and the sidewall portions are disposed along inner sidewalls of gate spacers.

20. The method of claim 19, wherein etching the deposited layer of the dielectric material is performed by a plasma etching process.

* * * * *